(12) United States Patent
Choi et al.

(10) Patent No.: US 10,332,607 B2
(45) Date of Patent: Jun. 25, 2019

(54) METHODS OF OPERATING A NONVOLATILE MEMORY DEVICE AND THE NONVOLATILE MEMORY DEVICE THEREOF

(71) Applicant: SAMSUNG ELECTRONICS CO., LTD., Suwon-si, Gyeonggi-Do (KR)

(72) Inventors: Na-Young Choi, Hwaseong-si (KR); Il-Han Park, Suwon-si (KR); Seung-Hwan Song, Incheon (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/830,679

(22) Filed: Dec. 4, 2017

(65) Prior Publication Data

US 2018/0261296 A1 Sep. 13, 2018

(30) Foreign Application Priority Data

Mar. 13, 2017 (KR) ........................ 10-2017-0031037

(51) Int. Cl.
| | |
|---|---|
| *G11C 16/34* | (2006.01) |
| *G11C 16/28* | (2006.01) |
| *G11C 16/08* | (2006.01) |
| *G06F 11/10* | (2006.01) |
| *G11C 16/24* | (2006.01) |
| *G11C 29/02* | (2006.01) |

(Continued)

(52) U.S. Cl.
CPC ...... *G11C 16/3431* (2013.01); *G06F 11/1068* (2013.01); *G11C 11/5642* (2013.01); *G11C 16/08* (2013.01); *G11C 16/24* (2013.01); *G11C 16/28* (2013.01); *G11C 16/3427* (2013.01); *G11C 29/021* (2013.01); *G11C 29/028* (2013.01); *G11C 29/42* (2013.01); *G11C 16/0483* (2013.01); *G11C 29/52* (2013.01); *G11C 2211/5642* (2013.01)

(58) Field of Classification Search
CPC ..... G11C 16/3431; G11C 16/08; G11C 16/24; G11C 16/28; G11C 29/52; G11C 16/3427; G11C 16/0483; G11C 29/021; G11C 29/028; G11C 29/42; G11C 2211/5642; G06F 11/1068
USPC ................................................. 365/185.02
See application file for complete search history.

(56) References Cited

U.S. PATENT DOCUMENTS

| | | |
|---|---|---|
| 7,889,563 B2 | 2/2011 | Cho et al. |
| 9,007,839 B2 | 4/2015 | Lee et al. |

(Continued)

*Primary Examiner* — Sung Il Cho
(74) *Attorney, Agent, or Firm* — F. Chau & Associates, LLC

(57) ABSTRACT

In a method of operating a nonvolatile memory device including a memory cell array, where the memory cell array includes a plurality of pages, and each of the plurality of pages includes a plurality of nonvolatile memory cells, a first sampling read operation is performed to count a first number of memory cells in a first region of a first page selected from the plurality of pages, using a first default read voltage and a first offset read voltage, and a second sampling read operation is selectively performed to count a second number of memory cells in a second region of the first page, using the first default read voltage and a second offset read voltage, based on a comparison result of the first number and a first reference value. The second offset read voltage is different from the first offset read voltage.

18 Claims, 22 Drawing Sheets

(51) Int. Cl.
  *G11C 29/42*   (2006.01)
  *G11C 11/56*   (2006.01)
  *G11C 29/52*   (2006.01)
  *G11C 16/04*   (2006.01)

(56) References Cited

U.S. PATENT DOCUMENTS

| | | |
|---|---|---|
| 9,009,390 B2 | 4/2015 | Choi et al. |
| 9,036,417 B2 | 5/2015 | Chen et al. |
| 9,111,626 B2 | 8/2015 | Kim et al. |
| 9,117,536 B2 | 8/2015 | Yoon et al. |
| 9,330,775 B2 | 5/2016 | Kim et al. |
| 2003/0223277 A1* | 12/2003 | Origasa ............... G11C 7/06 365/189.11 |
| 2011/0235420 A1* | 9/2011 | Sharon ............ G11C 11/5642 365/185.17 |
| 2012/0182797 A1* | 7/2012 | Zhao ............... G11C 11/5642 365/185.03 |
| 2014/0359202 A1 | 12/2014 | Sun et al. |
| 2015/0043282 A1* | 2/2015 | Shin ............... G11C 16/3495 365/185.21 |
| 2015/0127883 A1* | 5/2015 | Chen ............... G11C 11/5642 711/103 |
| 2016/0147582 A1 | 5/2016 | Karakulak et al. |
| 2016/0225440 A1 | 8/2016 | Han et al. |

\* cited by examiner

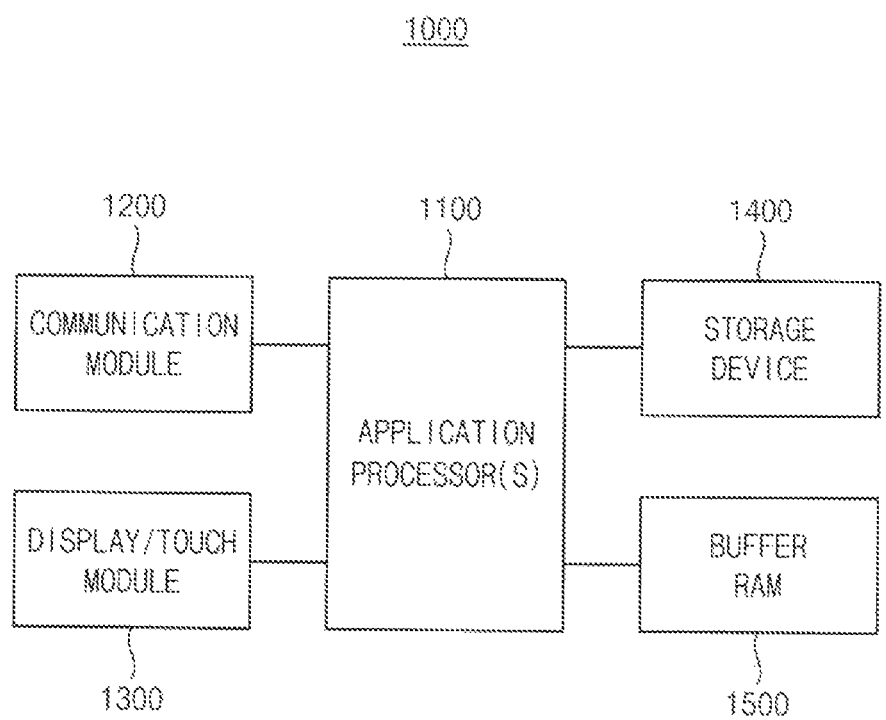

METHODS OF OPERATING A NONVOLATILE MEMORY DEVICE AND THE NONVOLATILE MEMORY DEVICE THEREOF

CROSS-REFERENCE TO RELATED APPLICATION

This US application claims priority under 35 USC § 119 to Korean Patent Application No. 10-2017-0031037, filed on Mar. 13, 2017, in the Korean Intellectual Property Office (KIPO), the disclosure of which is incorporated in its entirety by reference herein.

TECHNICAL FIELD

Exemplary embodiments relate generally to semiconductor memory devices, and more particularly to methods of operating a nonvolatile memory device and the nonvolatile memory device thereof.

DISCUSSION OF RELATED ART

A semiconductor memory device is a storage device which is fabricated with semiconductors such as, but not limited to, silicon (Si), germanium (Ge), gallium arsenide (GaAs), and indium phosphide (InP). Semiconductor memory devices may be classified into a volatile memory and a nonvolatile memory depending on data retention characteristics of the memory devices upon being cut off from power supply.

The volatile memory may lose contents stored therein at power-off. The volatile memory includes the following: a static RAM (SRAM), a dynamic RAM (DRAM), and a synchronous DRAM (SDRAM). The nonvolatile memory may retain stored contents even at power-off. The nonvolatile memory includes the following: a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM).

The flash memory may have the following advantages: mass storage capability, relatively high noise immunity, and low power operation. To increase storage capacity, the flash memory may be formed of a multi-level cell which stores two or more bits of data per cell. Where at least two or more data bits are stored in one memory cell, the number of program states required to accommodate the data bits may be increased. Therefore, read margin between two adjacent program states may be reduced. The flash memory having such reduced read margin may be vulnerable to read failure during a read operation.

In addition, data read from memory cells includes error bits due to physical factors such as program disturbance and read disturbance generated by adjacent memory cells due to fabrication scaling. Such error bits may be corrected using error correcting methods.

SUMMARY

Some exemplary embodiments are directed to provide a method of operating a nonvolatile memory device, capable of enhancing performance and data reliability.

According to exemplary embodiments, a nonvolatile memory device may include a memory cell array which includes a plurality of pages. Each of the plurality of pages includes a plurality of nonvolatile memory cells, each of the plurality of nonvolatile memory cells stores a plurality of data bits, and the plurality of data bits may be distinguished from one another by different threshold voltages. A first sampling read operation is performed to count a first number of memory cells in a first region of a first page selected from the plurality of pages, using a first default read voltage and a first offset read voltage, in response to a command and an address received from a memory controller. A second sampling read operation is selectively performed to count a second number of memory cells in a second region of the first page, using the first default read voltage and a second offset read voltage, based on a comparison result of the first number and a first reference value. The second offset read voltage is different from the first offset read voltage.

According to exemplary embodiments, a nonvolatile memory device includes a memory cell array, a page buffer circuit, a voltage generator, and a control circuit. The memory cell array includes a plurality of pages, each of the plurality of pages includes a plurality of nonvolatile memory cells, each of the plurality of nonvolatile memory cells stores a plurality of data bits, and the plurality of data bits may be distinguished from one another by different threshold voltages. The page buffer circuit is coupled to the memory cell array through a plurality of bit-lines. The voltage generator generates a first default read voltage, a first offset read voltage, and a second offset read voltage. The control circuit, through the voltage generator and the page buffer circuit, performs a first sampling read operation to count a first number of memory cells in a first region of a first page selected from the plurality of pages, using the first default read voltage and the first offset read voltage, in response to a command and an address received from a memory controller, and performs, selectively, a second sampling read operation to count a second number of memory cells in a second region of the first page, using the first default read voltage and the second offset read voltage, based on a comparison result of the first number and a first reference value greater than a zero. The second offset read voltage is different from the first offset read voltage.

According to exemplary embodiments, in a method of operating a nonvolatile memory device including a memory cell array which includes a plurality of pages, each of the plurality of pages includes a plurality of nonvolatile memory cells, and each of the plurality of nonvolatile memory cells stores a plurality of data bits. Randomized data may be programmed in a first page selected among the plurality of pages in response to a program command such that each of the plurality of nonvolatile memory cells is configured to store the plurality of data bits as one of a plurality of threshold voltage distributions corresponding to a plurality of logic states. A read command and an address may be received from a memory controller. A read operation may be performed on the first page in response to the read command and the address. The read operation includes a first sampling read operation on a first region of the first page and a selective second sampling read operation on a second region of the first page.

Accordingly, the nonvolatile memory device, during a normal read operation, counts a first number of memory cells in a first region defined by the first default read voltage and a first offset read voltage, determines degree of degradation of memory cells based on a comparison of the first number and a first reference value and selectively perform a second sampling read operation based on the determination.

Therefore, the read operation may be performed faster when the read data are determined to be passed after counting the first number.

BRIEF DESCRIPTION OF THE DRAWINGS

Illustrative, non-limiting exemplary embodiments will be more clearly understood from the following detailed description in conjunction with the accompanying drawings.

FIG. 20 is a block diagram illustrating a mobile device according to exemplary embodiments.

DETAILED DESCRIPTION OF THE EMBODIMENTS

Various exemplary embodiments will be described more fully hereinafter with reference to the accompanying drawings, in which some exemplary embodiments are shown.

Figure 1:
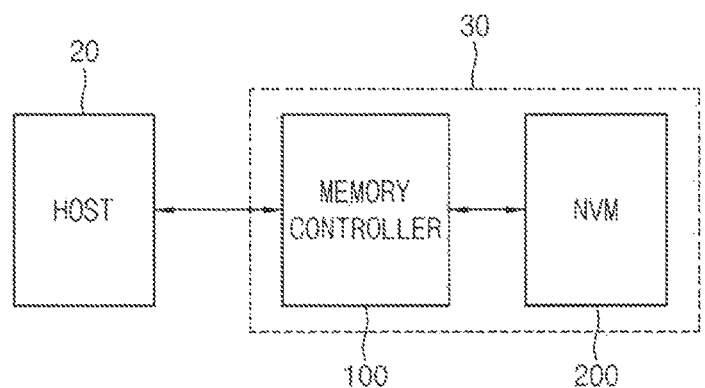
FIG. 1 is a block diagram illustrating an electronic device according to exemplary embodiments.

FIG. 1 is a block diagram illustrating an electronic device according to exemplary embodiments.

Referring to FIG. 1, an electronic device 10 may include a host 20 and a store device (or, a memory system) 30. The storage device 30 may include a memory controller 100 and at least one nonvolatile memory device 200. The host 20 may control overall operation of the storage device 30.

The nonvolatile memory device 200 may be implemented with a NAND flash memory. In exemplary embodiments, the nonvolatile memory device 200 may be a commonly available nonvolatile memory device such as Phase Change Random Access Memory (PRAM), Resistance Random Access Memory (RRAM), Magneto-resistive Random Access Memory (MRAM), Ferroelectric random access memory (FRAM), etc.

The memory controller 100 may exchange the signals such as a command, an address, data, etc. with the host 20. The memory controller 100 may write data in the nonvolatile memory device 200 and reads data from the nonvolatile memory device 200 according to a command from the host 20.

Figure 2:
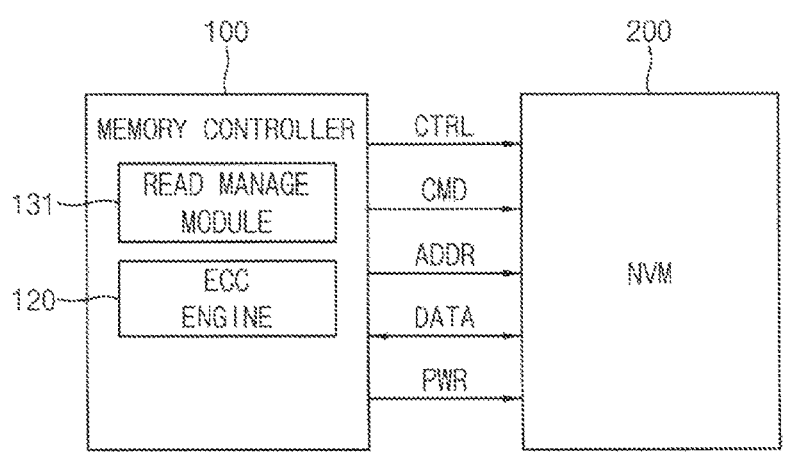
FIG. 2 is a block diagram illustrating the storage device in FIG. 1 according to exemplary embodiments.

FIG. 2 is a block diagram illustrating the storage device in FIG. 1 according to exemplary embodiments.

Referring to FIG. 2, the storage device 30 may include the memory controller 100 and the at least one nonvolatile memory device 200.

In exemplary embodiments, each of the memory controller 100 and the nonvolatile memory device 200 may be provided with the form of a chip, a package, or a module. Alternatively, the memory controller 100 and the nonvolatile memory device 200 may be packaged one of Package on Package (PoP), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP) and etc.

The nonvolatile memory device 200 may perform an erase operation, a program operation or a write operation under control of the memory controller 100. The nonvolatile memory device 200 receives a command CMD, an address ADDR and data DATA through input/output lines from the memory controller 100 for performing such operations. In addition, the nonvolatile memory device 200 receives a control signal CTRL through a control line from the memory controller 100. In addition, the nonvolatile memory device 200 receives a power PWR through a power line from the memory controller 100.

Memory cells of the nonvolatile memory device 200 have different threshold voltages depending on the data states and the physical characteristics of the memory cells as the threshold voltages of the memory cells may be affected by a program elapsed time, a temperature, program disturbance, or read disturbance. Due to the reasons described above, data stored in the nonvolatile memory device 200 may become deteriorated and result in read data error. For correcting such data errors, the memory controller 100 may utilize a variety of error correction techniques. For example, the memory controller 100 includes an error correction code (ECC) engine 120 and a read manage module 131.

During a read operation, the memory controller 100 may read data stored in a first page of the nonvolatile memory device 200, using a default read voltage set. The default read voltage set may include predetermined read voltages. The ECC engine 120 may detect and correct errors included in data read from the nonvolatile memory device 200. In exemplary embodiments, the ECC engine 120 may be implemented in the form of hardware.

Data read in a read operation may include error bits more than the ECC engine 120 may correct. In this case, the ECC engine 120 fails to correct the errors of the data, which may be referred to as an 'uncorrectable error correction code (UECC) error'. Data having the UECC error may be referred to as an 'UECC data'.

When the UECC error occurs, the read manage module 131 may adjust a read voltage set of the nonvolatile memory device 200. The memory controller 100 may repeat to send same address ADDR, command CMD, and control signal CTRL with previously sent to the nonvolatile memory device 200 to perform a read operation with adjusted read voltage set.

The adjusted read voltage set may be included in the control signal CTRL or the command CMD. The ECC engine 120 may repeat to detect and correct an error of read data that is read with the adjusted read voltage set until the UECC error being corrected.

In exemplary embodiments, the read manage module 131 may repeat to adjust a read voltage set for the predetermined number of times, and the ECC engine 120 may repeat to detect and correct an error of data that is read using the adjusted read voltage set. For example, the memory controller 100 may repeat a set of operations the predetermined number of times, adjusting a read voltage set, reading data using the adjusted read voltage set, and correcting an error of the read data.

When an error of read data is corrected during iteration of the set of operations, the memory controller 100 may output corrected data to the host 20 and stop iteration of the set of operations. When a read operation is iterated under a control of the read manage module 131, for example, read data or particular page data of the read data may be stored in a buffer 130 shown in FIG. 3. The buffer 130 may be a static random access memory (SRAM).

When an error of read data is not corrected after iteration of the set of operations (i.e., when the UECC error occurs), the memory controller 100 determines a starting voltage set for performing valley search operation based on the data stored in the buffer 130.

In exemplary embodiments, iteration of adjusting a read voltage set and reading data using the adjusted read voltage set may be skipped.

When an error of read data is not corrected after the read operation based on the default read voltage set or after iteration of the set of operations, the memory controller 100 selects a program state which includes a highest error bit ratio, among the data stored in the buffer 130 and determines a read voltage corresponding to the selected program state as the a starting voltage set. The read manage module 131 performs a valley search operation based on the determined starting voltage set to determine an optimal read level voltage and performs a recovery read operation on the read data based on the optimal read level voltage.

For determining the optimal read level voltage, the read manage module 131 sets a search region defined by a staring read voltage and ending read voltage, determines whether the search region belongs to a reference region, changes the search region if the search region does not belong to the reference region, and finds new read voltage to determines the optimal read level voltage if the search region belongs to the reference region.

When an error of read data is corrected (that is, the read data includes correctable errors or no error) after the recovery read operation based on the optimal read level voltage, the ECC engine 120 notifies a reclaim manage module (not illustrated) of the error of the read data being corrected.

The reclaim manage module determines whether to perform a reclaim of the first page based on threshold voltage distributions of memory cells in a region of interest near the optimal read level voltage.

The nonvolatile memory device 200, when a read operation on a first page selected from a memory cell array is performed, performs a first sampling read operation to count a first number of memory cells in a first region of the first page, using a first default read voltage and a first offset read voltage and performs selectively a second sampling read operation to count a second number of memory cells in a second region of the first page, using the first default read voltage and a second offset read voltage, based on a comparison of the first number and a first reference value greater. The first region may be defined by the first default read voltage and the first offset read voltage and the second region may be defined by the first default read voltage and the second offset read voltage. Therefore, the nonvolatile memory device 200 may autonomously (internally) adjust a level of read voltage according to change of the threshold voltage distribution without intervention of the memory controller 100.

Figure 3:
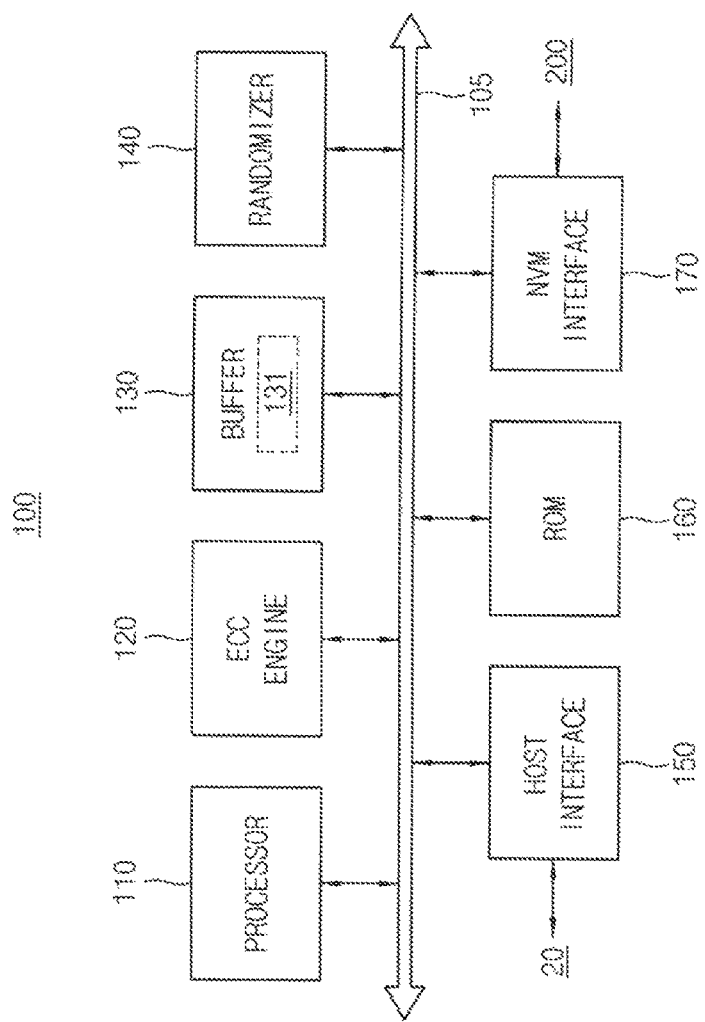
FIG. 3 is a block diagram illustrating the memory controller in the storage device of FIG. 2 according to exemplary embodiments.

FIG. 3 is a block diagram illustrating the memory controller in the storage device of FIG. 2 according to exemplary embodiments.

Referring to FIGS. 2 and 3, the memory controller 100 may include a processor 110, an ECC engine 120, a buffer 130, a read manage module 131, a randomizer 140, a host interface 150, a read only memory (ROM) 160 and a nonvolatile memory interface 170 which are connected via a bus 105. The ECC engine 120, the buffer 130 and the read manage module 131 performs substantially same function described above relating with FIG. 2.

The processor 110 controls an overall operation of the memory controller 100. In exemplary embodiments, the read manage module 131 may be implemented in software and stored in the buffer 130. The read manage module 131 stored in the buffer 130 may be driven by the processor 110. The ROM 160 stores a variety of information, needed for the memory controller 100 to operate, in firmware.

The randomizer 140 randomizes data to be stored in the nonvolatile memory device 200. For example, the randomizer 140 randomizes data to be stored in the nonvolatile memory device 200 on a word-line basis.

Data randomizing is to process data to balance ratio of each data states. For example, if memory cells connected to one word-line are multi-level cells (MLC) each storing 2-bit data, each of the memory cells has one of an erase state and first through third program states. In this case, the randomizer 140 randomizes data of the memory cells connected to one word-line to balance the number of each data states of the memory cells. Thus, the number of memory cells having the erase state, the number of memory cells having the first program state, the number of memory cells having the second program state, and the number of memory cells having the third program state become substantially equal. The randomizer 140 de-randomizes data read from the nonvolatile memory device 200 to recover original data from the randomized data after reading out the data from the memory cells.

Alternatively, the randomizer 140 may randomize data on a page basis. For this embodiment, the randomizer 140 randomizes data for each state of memory cells to be approximately equal in numbers. Thus, the number of memory cells programmed into one state is similar to the number of memory cells to programmed into other state, though the numbers may not be same.

The memory controller 100 communicates with the host 20 through the host interface 150. For example, the host interface 150 may include Universal Serial Bus (USB), Multimedia Card (MMC), embedded-MMC, peripheral component interconnection (PCI), PCI-express, Advanced Technology Attachment (ATA), Serial-ATA, Parallel-ATA, small computer system interface (SCSI), enhanced small disk interface (ESDI), Integrated Drive Electronics (IDE), Mobile Industry Processor Interface (MIPI), Nonvolatile memory express (NVMe), Universal Flash Storage (UFS), and etc. The memory controller 100 communicates with the nonvolatile memory device 200 through the nonvolatile memory interface 170.

Figure 4:
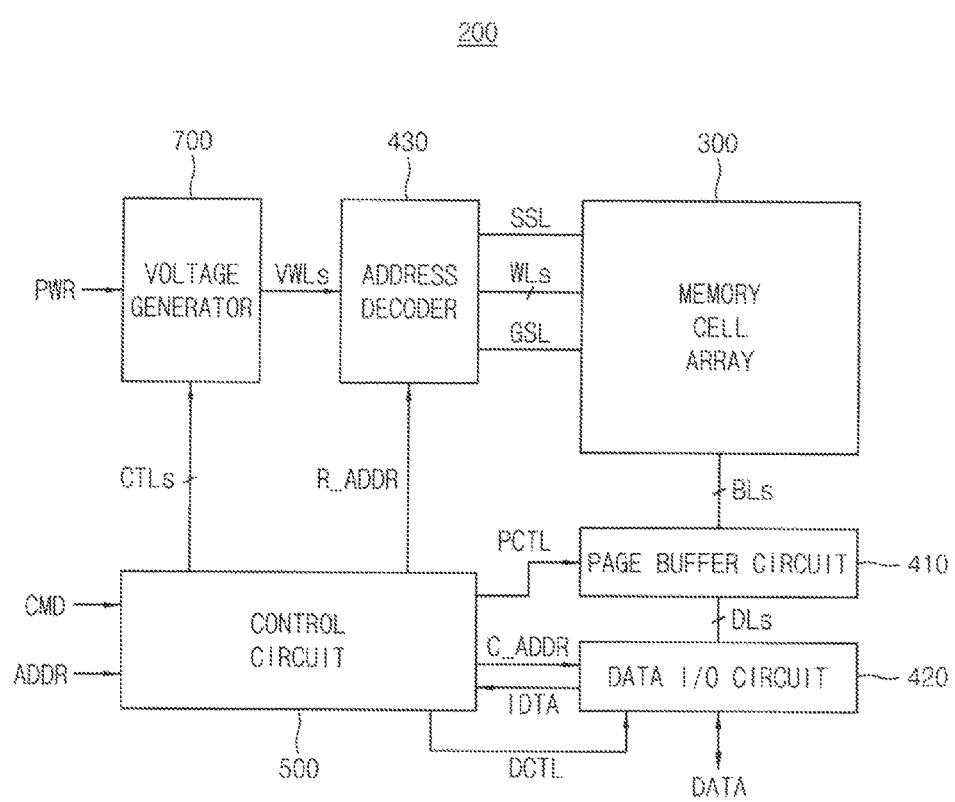
FIG. 4 is a block diagram illustrating the nonvolatile memory device in the storage device of FIG. 2 according to exemplary embodiments.

FIG. 4 is a block diagram illustrating the nonvolatile memory device in the storage device of FIG. 2 according to exemplary embodiments.

Referring to FIG. 4, the nonvolatile memory device 200 includes a memory cell array 300, an address decoder 430, a page buffer circuit 410, a data input/output circuit 420, a control circuit 500 and a voltage generator 700.

The memory cell array 300 may be coupled to the address decoder 430 through a string selection line SSL, a plurality of word-lines WLs, and a ground selection line GSL. In addition, the memory cell array 300 may be coupled to the page buffer circuit 410 through a plurality of bit-lines BLs.

The memory cell array 300 may include a plurality of memory cells coupled to the plurality of word-lines WLs and the plurality of bit-lines BLs.

In some exemplary embodiments, the memory cell array 300 may be a three-dimensional memory cell array, which is formed on a substrate in a three-dimensional structure (or a vertical structure). In this case, the memory cell array 300 may include vertical cell strings that are vertically oriented such that at least one memory cell is located over another memory cell. The following patent documents, which are hereby incorporated by reference, describe suitable configurations for three-dimensional memory cell arrays: U.S. Pat. Nos. 7,679,133; 8,553,466; 8,654,587; 8,559,235; and US Pat. Pub. No. 2011/0233648.

In other exemplary embodiments, the memory cell array 300 may be a two-dimensional memory cell array, which is formed on a substrate in a two-dimensional structure (or a horizontal structure).

Figure 5:
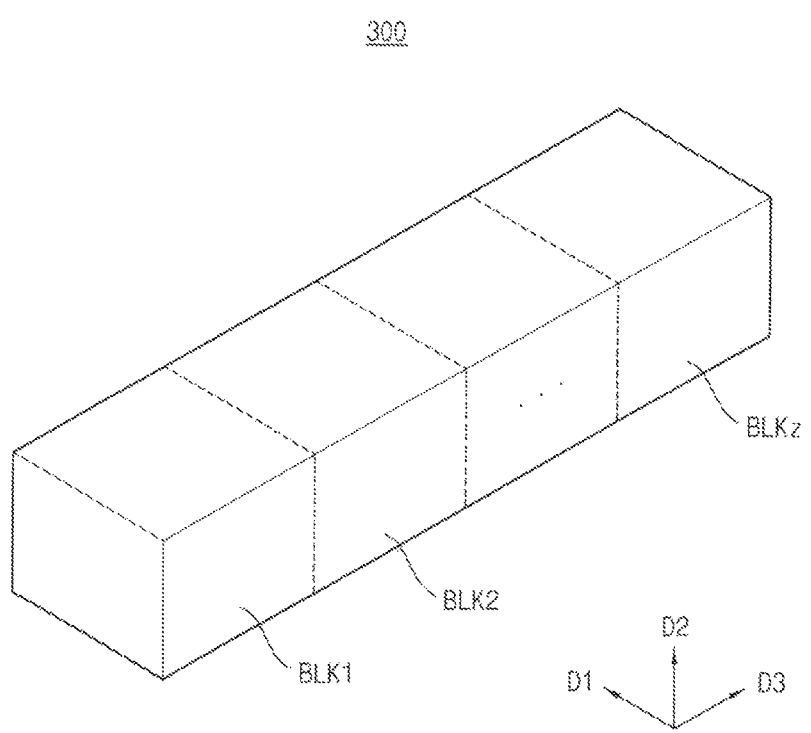
FIG. 5 is a block diagram illustrating the memory cell array in FIG. 4.

FIG. 5 is a block diagram illustrating the memory cell array in FIG. 4.

Referring to FIG. 5, the memory cell array 300 may include a plurality of memory blocks BLK1 to BLKz. In an embodiment, the memory blocks BLK1 to BLKz are selected by the address decoder 430 in FIG. 4. For example, the address decoder 430 may select a memory block BLK corresponding to a block address among the memory blocks BLK1 to BLKz.

Figure 6:
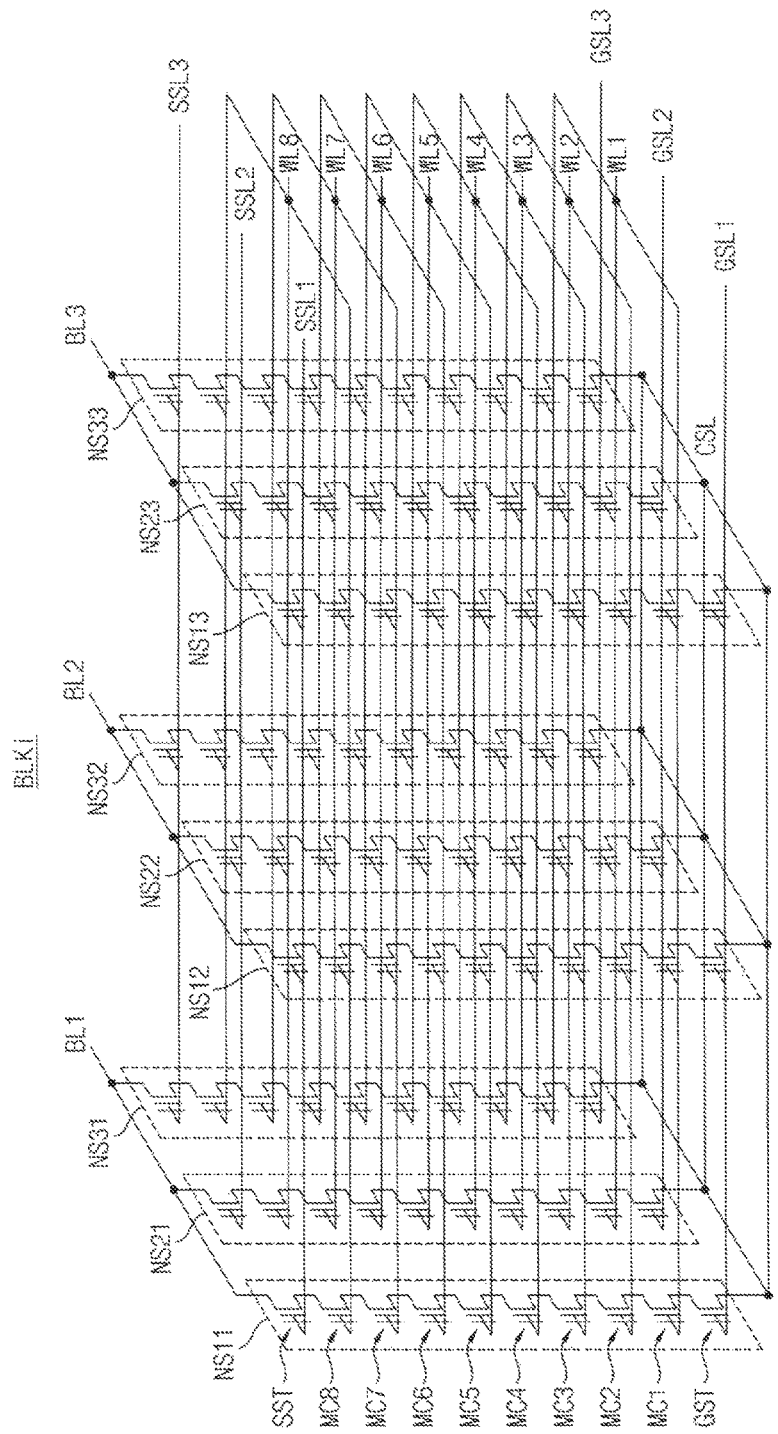
FIG. 6 is a circuit diagram illustrating one of the memory blocks in FIG. 5.

FIG. 6 is a circuit diagram illustrating one of the memory blocks in FIG. 5.

The memory block BLKi of FIG. 6 may be formed on a substrate in a three-dimensional structure (or a vertical structure). For example, a plurality of memory cell strings included in the memory block BLKi may be formed in a direction perpendicular to the substrate.

Referring to FIG. 6, a memory block BLKi may include memory cell strings NS11 to NS33 coupled between bit-lines BL1, BL2 and BL3 and a common source line CSL. Each of the memory cell strings NS11 to NS33 may include a string selection transistor SST, a plurality of memory cells MC1 to MC8, and a ground selection transistor GST. In FIG. 6, each of the memory cell strings NS11 to NS33 is illustrated to include eight memory cells MC1 to MC8. However, exemplary embodiments are not limited thereto. In some exemplary embodiments, each of the memory cell strings NS11 to NS33 may include any number of memory cells.

The string selection transistor SST may be connected to corresponding string selection lines SSL1 to SSL3. The plurality of memory cells MC1 to MC8 may be connected to corresponding word-lines WL1 to WL8, respectively. The ground selection transistor GST may be connected to corresponding ground selection lines GSL1 to GSL3. The string selection transistor SST may be connected to corresponding bit-lines BL1, BL2 and BL3, and the ground selection transistor GST may be connected to the common source line CSL.

Word-lines (e.g., WL1) having the same height may be commonly connected, and the ground selection lines GSL1 to GSL3 and the string selection lines SSL1 to SSL3 may be separated. In FIG. 6, the memory block BLKb is illustrated to be coupled to eight word-lines WL1 to WL8 and three bit-lines BL1 to BL3. However, exemplary embodiments are not limited thereto. In some exemplary embodiments, the memory cell array 300 may be coupled to any number of word-lines and bit-lines.

Referring back to FIG. 4, the control circuit 500 may receive a command (signal) CMD and an address (signal) ADDR from the memory controller 100 and control an erase loop, a program loop and a read operation of the nonvolatile memory device 200 based on the command signal CMD and the address signal ADDR. The program loop may include a program operation and a program verification operation. The erase loop may include an erase operation and an erase verification operation.

For example, the control circuit 500 may generate control signals CTLs to control the voltage generator 700, a page buffer control signal PCTL to control the page buffer circuit 410 and a data control signal DCTL to generate the data input/output circuit 420 based on the command signal CMD. The control circuit 500 may generate a row address R_ADDR and a column address C_ADDR based on the address signal ADDR. The control circuit 500 may provide the row address R_ADDR to the address decoder 430 and provide the column address C_ADDR to the data input/output circuit 420.

The address decoder 430 may be coupled to the memory cell array 300 through the string selection line SSL, the plurality of word-lines WLs, and the ground selection line GSL. During the program operation or the read operation, the address decoder 430 may determine one of the plurality of word-lines WLs as a selected word-line and determine rest of the plurality of word-lines WLs except for the selected word-line as unselected word-lines based on the row address R_ADDR.

The voltage generator 700 may generate word-line voltages VWLs, which are required for the operation of the nonvolatile memory device 200, based on the control signals CTLs. The voltage generator 700 may receive the power PWR from the memory controller 100. The word-line voltages VWLs may be applied to the plurality of word-lines WLs through the address decoder 430.

For example, during the erase operation, the voltage generator 700 may apply an erase voltage to a well of the memory block and may apply a ground voltage to entire word-lines of the memory block. During the erase verification operation, the voltage generator 700 may apply an erase verification voltage to the entire word-lines of the memory block or sequentially apply the erase verification voltage to word-lines in a word-line basis.

For example, during the program operation, the voltage generator 700 may apply a program voltage to the selected word-line and may apply a program pass voltage to the unselected word-lines. In addition, during the program verification operation, the voltage generator 700 may apply a program verification voltage to the selected word-line and may apply a verification pass voltage to the unselected word-lines.

In addition, during the read operation, the voltage generator 700 may apply a default read voltage and an offset read voltage to the selected word-line and may apply a read pass voltage to the unselected word-lines.

The page buffer circuit 410 may be coupled to the memory cell array 300 through the plurality of bit-lines BLs. The page buffer circuit 410 may include a plurality of page buffers. In some exemplary embodiments, one page buffer may be connected to one bit-line. In other exemplary embodiments, one page buffer may be connected to two or more bit-lines.

The page buffer circuit 410 may temporarily store data to be programmed in a selected page or data read out from the selected page.

The data input/output circuit 420 may be coupled to the page buffer circuit 410 through data lines DLs. During the program operation, the data input/output circuit 420 may receive program data DATA from the memory controller 100 and provide the program data DATA to the page buffer circuit 410 based on the column address C_ADDR received from the control circuit 500. During the read operation, the data input/output circuit 420 may provide read data DATA, which are stored in the page buffer circuit 410, to the memory controller 100 based on the column address C_ADDR received from the control circuit 500.

In addition, during a sampling read operation, the data input/output circuit 420 may provide read data DATA, which are stored in the page buffer circuit 410, to the control circuit 500 as internal data IDTA. The control circuit 500 counts a first number of memory cells in a first region and selectively count a second number of memory cells in a second region based on a result of counting the first number of memory cells, with respect to the internal data IDTA.

In addition, the page buffer circuit 410 and the data input/output circuit 420 read data from a first storage region of the memory cell array 300 and write the read data to a second storage region of the memory cell array 300. That is, the page buffer circuit 410 and the data input/output circuit 420 may perform a copy-back operation. The page buffer circuit 410 and the data input/output circuit 420 may be controlled by the control circuit 500.

Figure 7:
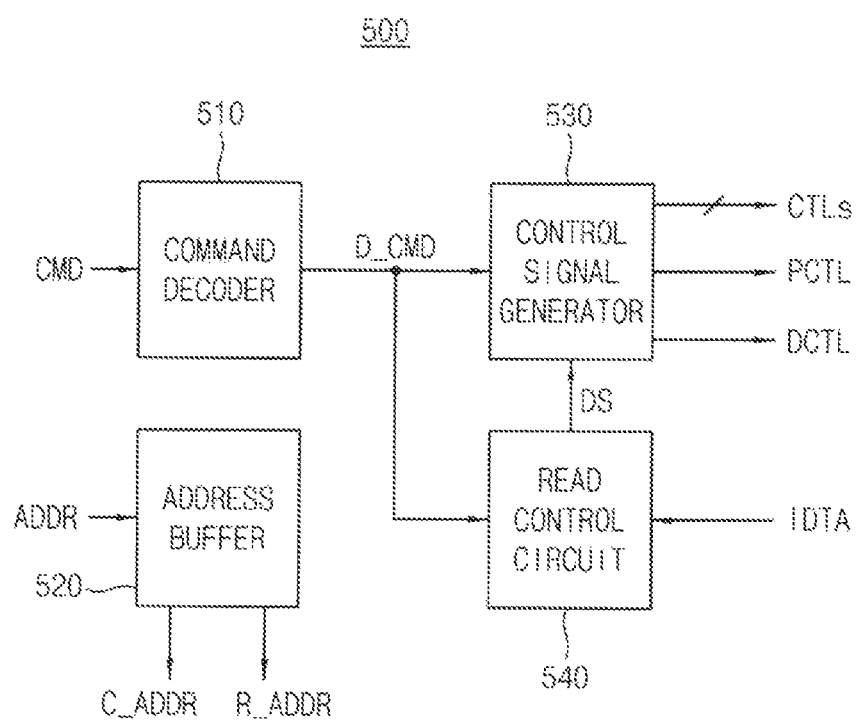
FIG. 7 is a block diagram illustrating the control circuit in the nonvolatile memory device of FIG. 4 according to exemplary embodiments.

FIG. 7 is a block diagram illustrating the control circuit in the nonvolatile memory device of FIG. 4 according to exemplary embodiments.

Referring to FIG. 7, the control circuit 500 includes a command decoder 510, an address buffer 520, a control signal generator 530 and a read control circuit 540.

The command decoder 510 decodes the command CMD and provides a decoded command D_CMD to the control signal generator 530. When the decoded command D_CMD is a read command, the command decoder 510 provides the decoded command D_CMD to the to the read control circuit 540.

The address buffer 520 receives the address signal ADDR, provides the row address R_ADDR to the address decoder 430 and provides the column address C_ADDR to the data input/output circuit 420.

The read control circuit 540 receives the internal data IDTA from the data input/output circuit 420, counts a first number of memory cells in a first region, selectively count a second number of memory cells in a second region based on a result of counting the first number of memory cells, with respect to the internal data IDTA and provides the control signal generator 530 with a decision signal DS indicating a result of the counting operation.

The control signal generator 530 receives the decoded command D_CMD and the decision signal DS, generates the control signals CTLs based on an operation directed by the decoded command D_CMD and provides the control signals CTLs to the voltage generator 700. In addition, the control signal generator 530 receives the decision signal DS, generates the page buffer control signal PCTL and the data control signal DCTL according to a degree of degradation of the threshold voltage distribution indicated by the decision signal DS, provides the page buffer control signal PCTL to the page buffer circuit 410 and provides the data control signal DCTL to the data input/output circuit 420.

Figure 8:
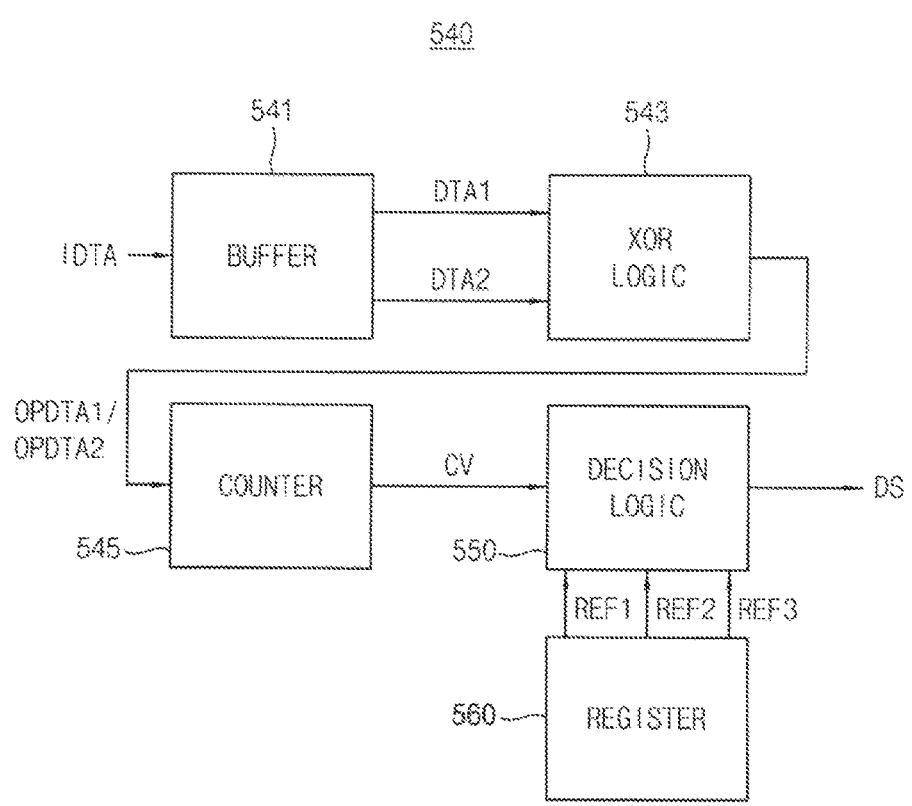
FIG. 8 is block diagram illustrating the read control circuit in the control circuit of FIG. 7 according to exemplary embodiments.

FIG. 8 is block diagram illustrating the read control circuit in the control circuit of FIG. 7 according to exemplary embodiments.

Referring to FIG. 8, the read control circuit 540 includes a buffer 541, an exclusive OR logic 543, a counter 545, a decision logic 550 and a register 560.

When the first sampling read operation is performed on a selected first page, the buffer 541 stores the internal data IDTA sensed by applying the first default read voltage and the first offset read voltage, respectively, to a first word-line coupled to the first page and provides the internal data IDTA to the exclusive OR logic 543 as a first data DTA1 and a second data DTA2. The exclusive OR logic 543 performs an exclusive OR operation on the first data DTA1 and the second data DTA2 and output a first operation data ODTA1 which indicates a match between corresponding bits of the first data DTA1 and the second data DTA2.

The counter 545 counts a number of first bits, each having a first logic level, in the first operation data ODTA1 to output a counting value CV. The decision logic 550 compares the counting value CV and a first reference value REF1 and provides the control signal generator 530 with the decision signal DS indicating a result of the comparison. The register 560 may store first, second and third reference values REF1, REF2 and REF3. The first reference value REF1 is greater than zero, the second reference value REF2 is greater than the first reference value REF1 and the third reference value REF3 is greater than the second reference value REF2. The first, second and third reference values REF1, REF2 and REF3 may indicate degrees of degradation of the threshold voltage distributions of a page during testing the nonvolatile memory device 200 and may be predetermined and pre-stored in the register 560. The first reference value REF1 may be used for initial use of the nonvolatile memory device because it indicates that the degree of degradation is not yet problematic. As the number of program/erase operation of the nonvolatile memory device accumulates, the second reference value REF2 may be used because it has been set considering certain degree of the degradation, and the third reference value REF3 may be used when the degree of degradation proceeded closely to the limit allowed by the nonvolatile memory device.

When the number of the first bits in the first operation data ODTA1 is greater than the first reference value REF1, the second sampling read operation needs to be performed. In other words, if the number of the first bits in the first operation data ODTA1 is smaller than the first reference value REF1, the second sampling read operation may not be required because it is presumed that the number of second bits in the second operation would also be small enough.

When the second sampling read operation is performed on the first page, the buffer 541 stores the internal data IDTA sensed by applying the first default read voltage and the second offset read voltage, respectively, to the first word-line coupled to the first page and provides the internal data IDTA to the exclusive OR logic 543 as a first data DTA1 and a second data DTA2. The exclusive OR logic 543 performs an exclusive OR operation on the first data DTA1 and the second data DTA2 and output a second operation data ODTA2 which indicates a match between corresponding bits of the first data DTA1 and the second data DTA2.

The counter 545 counts a number of first bits, each having a first logic level, in the second operation data ODTA2 to output the counting value CV. The decision logic 550 compares the counting value CV and the second reference value REF2 and the third reference value REF3 and provides the control signal generator 530 with the decision signal DS indicating a result of the comparison.

Figure 9:
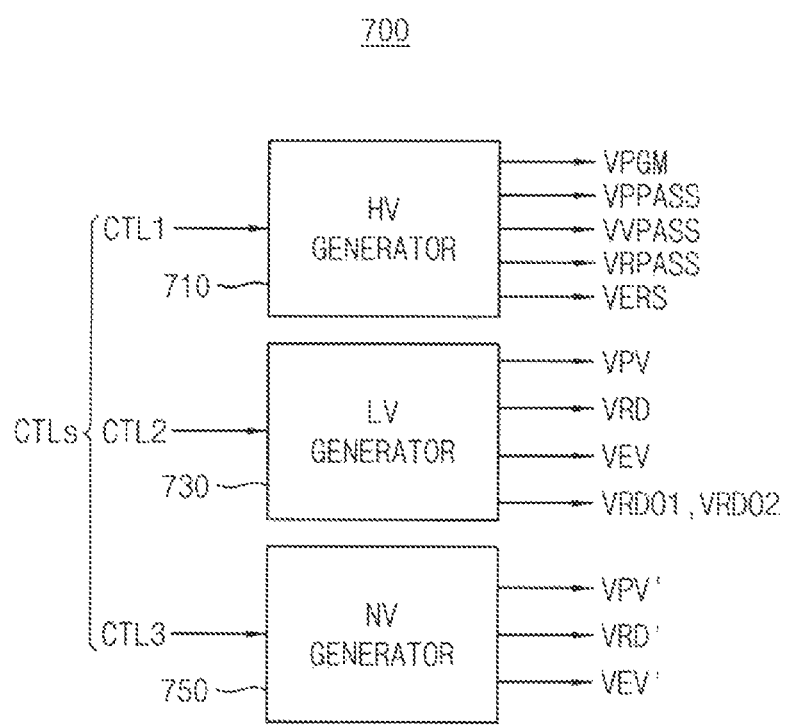
FIG. 9 is a block diagram illustrating the voltage generator in the nonvolatile memory device of FIG. 4 according to exemplary embodiments.

FIG. 9 is a block diagram illustrating the voltage generator in the nonvolatile memory device of FIG. 4 according to exemplary embodiments.

Referring to FIG. 9, the voltage generator 700 includes a high voltage generator 710 and a low voltage generator 730. The voltage generator 700 may further include a negative voltage generator 750.

The high voltage generator 710 may generate a program voltage VPGM, a program pass voltage VPPASS, a verification pass voltage VVPASS, a read pass voltage VRPASS and an erase voltage VERS according to operations directed by the command CMD, in response to a first control signal CTL1. The program voltage VPGM is applied to the selected word-line, the program pass voltage VPPASS, the verification pass voltage VVPASS, the read pass voltage VRPASS may be applied to the unselected word-lines and the erase voltage VERS may be applied to the well of the memory block. The first control signal CTL1 may include a plurality of bits which indicate the operations directed by the decoded command D_CMD.

The low voltage generator 730 may generate a program verification voltage VPV, an erase verification voltage VEV and a default read voltage VRD and offset read voltages VRDO1 and VRDO2 according to operations directed by the command CMD, in response to a second control signal CTL2. The program verification voltage VPV, the default read voltage VRD, the offset read voltages VRDO1 and VRDO2 and the erase verification voltage VEV may be applied to the selected word-line according to operation of the nonvolatile memory device 200. The second control signal CTL2 may include a plurality of bits which indicate the operations directed by the decode command D_CMD.

The negative voltage generator 750 may generate a program verification voltage VPV', a read voltage VRD' and an erase verification voltage VEV' which have negative levels according to operations directed by the command CMD, in response to a third control signal CTL3. The third control signal CTL3 may include a plurality of bits which indicate the operations directed by the decoded command D_CMD.

Figure 10:
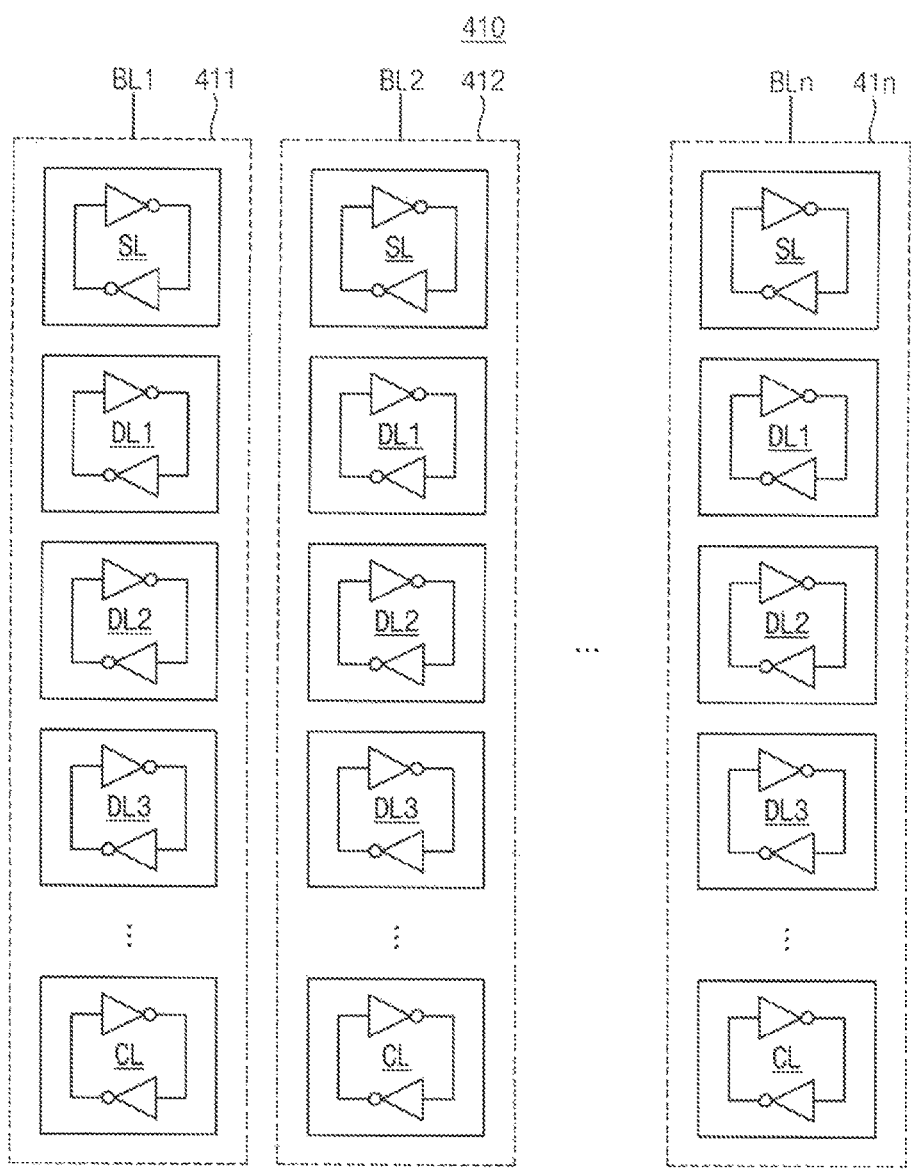
FIG. 10 illustrates the page buffer circuit in the nonvolatile memory device of FIG. 4 according to exemplary embodiments.

FIG. 10 illustrates the page buffer circuit in the nonvolatile memory device of FIG. 4 according to exemplary embodiments.

Referring to FIG. 10, the page buffer circuit 410 includes a plurality of page buffers 411~41n coupled to the memory cell array 300 through the bit-lines BL1~BLn. Each of the page buffers 411~41n includes latches for storing data when the sampling read operation is performed. Each of the page buffers 411~41n includes a sensing latch SL, data latches DL1, DL2 and DL3 and a cache latch CL. When a read command on the first page is received, the page buffers 411~41n perform sensing and latch operation. The page buffers 411~41n 123c may sense pre-charged voltages of bit-lines BL1~BLn at a point in time when each of the default read voltage VRD and the offset read voltages VORD1 and VORD2 is provided. Data sensed by the sensing latch SL is dumped into the data latches DL1, DL2 and DL3.

Figure 11:
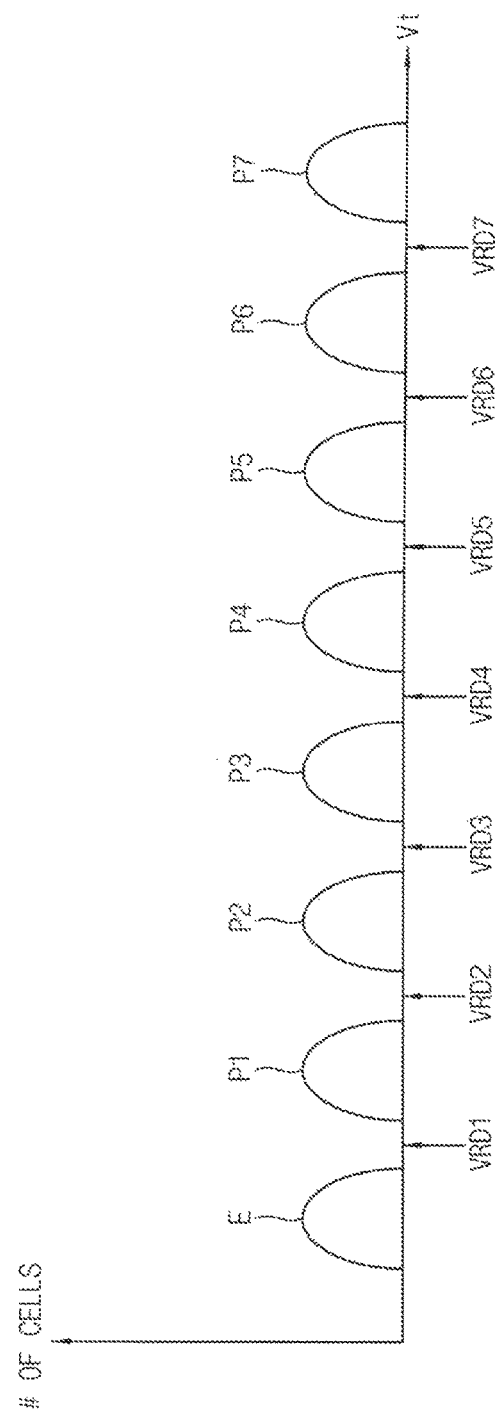
FIGS. 11 and 12 are diagrams for explaining threshold voltage distributions of one page in the memory cell array in FIG. 4.
Figure 12:
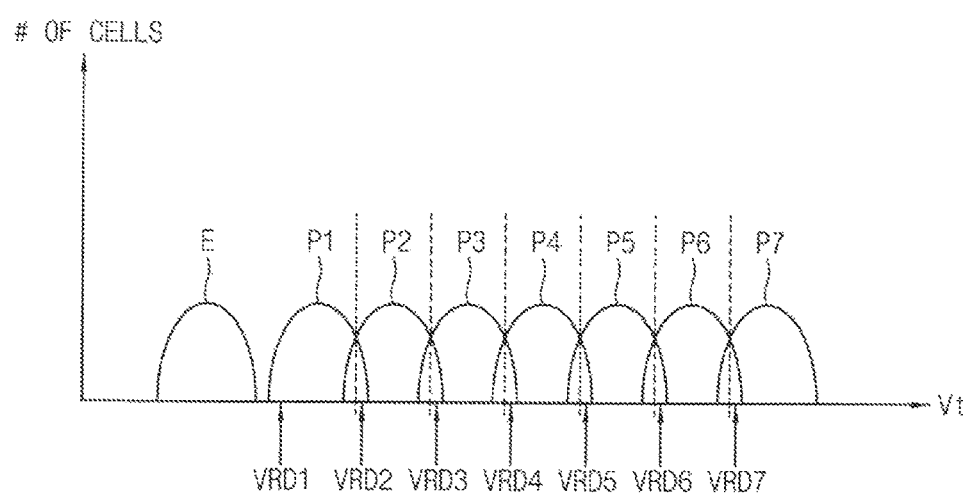

FIGS. 11 and 12 are diagrams for explaining threshold voltage distributions of one page in the memory cell array in FIG. 4. In FIGS. 11 and 12, the x-axis represents a threshold voltage Vt and the y-axis represents the number of memory cells.

For the convenience of description, it is assumed that memory cells of a nonvolatile memory device 200 are triple level cells (TLC) each storing three bits and a read voltage set for determining program states of memory cells includes seven read voltages.

Referring to FIG. 11, each memory cell of the nonvolatile memory device 200 has one of an erase state E and first through seventh program states P1 through P7. Under a control of the memory controller 100, the nonvolatile memory device 200 determines program states of memory cells using a default read voltage set VRD1 through VRD7 and outputs read data.

Voltage levels of the default read voltage set VRD1 through VRD7 may be predetermined depending on cell characteristics. For example, voltage levels of the default read voltage set VRD1 through VRD7 are predetermined depending on a threshold voltage distribution just after memory cells are programmed.

Referring to FIG. 12, a threshold voltage distribution of memory cells varies due to physical characteristics of memory cells or external factors as an elapsed time after the memory cells are programmed, as illustrated in FIG. 12. For this reason, the read data through a read operation using the default read voltage set VRD1 through VRD7 may include an error.

Figure 13:
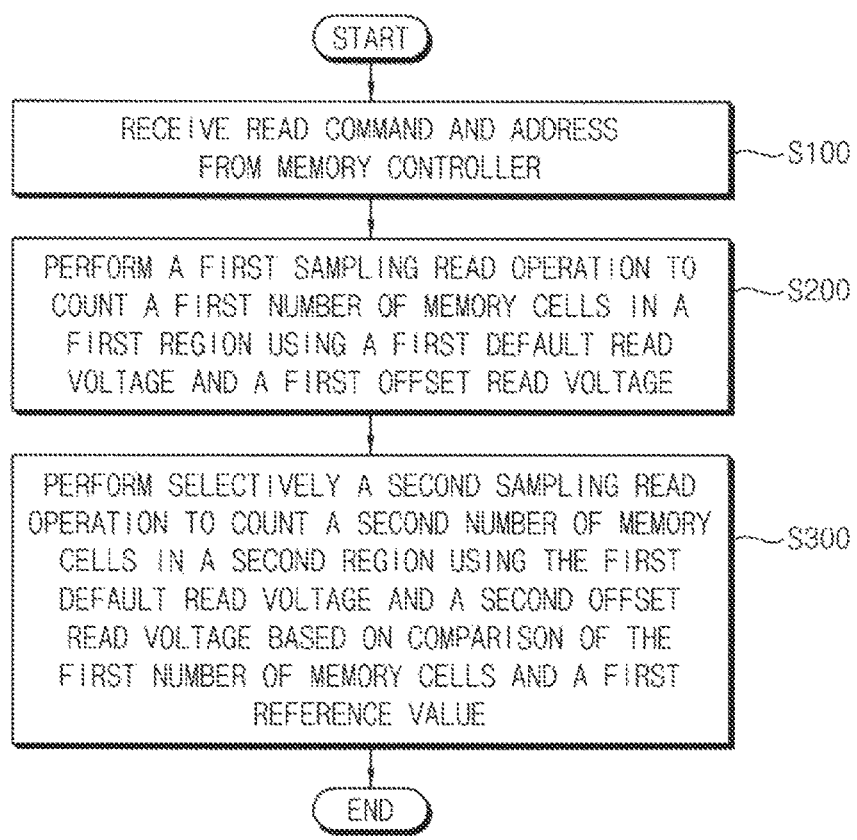
FIG. 13 is a flow chart illustrating a method of operating a nonvolatile memory device according to exemplary embodiments.
Figure 14:
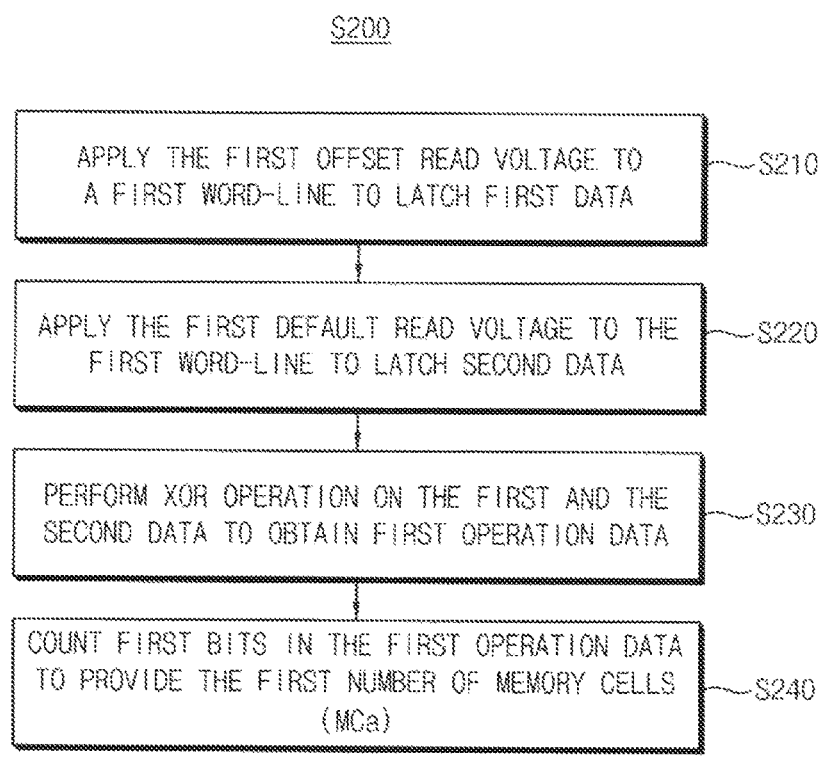
FIG. 14 is a flow chart illustrating a first sampling operation in FIG. 13.
Figure 15:
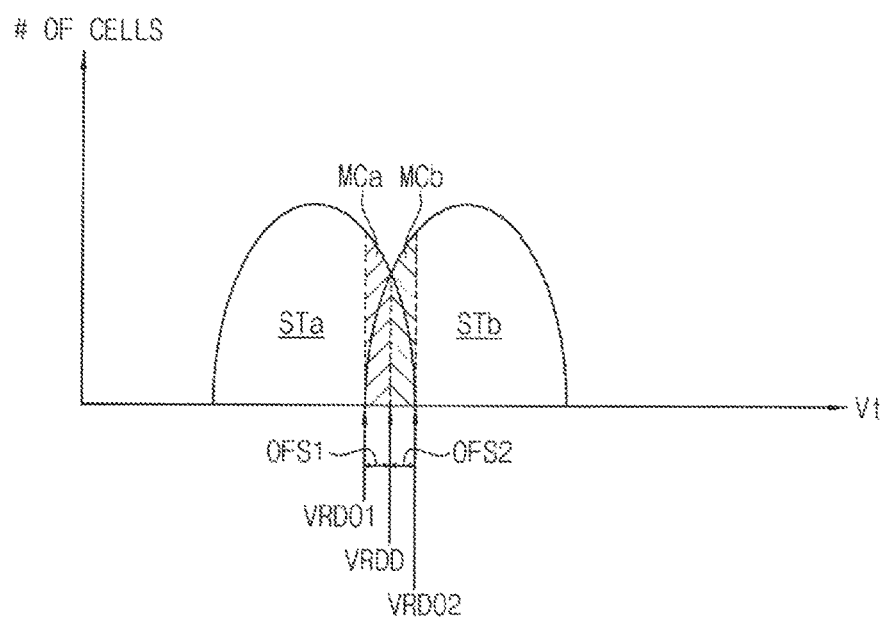
FIG. 15 is a diagram for explaining FIGS. 13 and 14.

FIG. 13 is a flow chart illustrating a method of operating a nonvolatile memory device according to exemplary embodiments, FIG. 14 is a flow chart illustrating a first sampling operation in FIG. 13 and FIG. 15 is a diagram for explaining FIGS. 13 and 14.

FIG. 15 illustrates adjacent threshold voltage distributions STa and STb which partially overlap, of the threshold voltage distributions in FIG. 11.

Referring to FIGS. 2 through 15, in a method of operating a nonvolatile memory device 200 including a memory cell array 300 which includes a plurality of pages, each page including a plurality of nonvolatile memory cells, each storing a plurality of data bits as one of a plurality of threshold voltage distributions corresponding to a plurality of logic states, the control circuit 500 receives a command and an address ADDR from the memory controller 100 (S100). The control circuit 500 performs a first sampling read operation to count a first number MCa of memory cells in a first region of a first page selected from the plurality of pages, using a first default read voltage VRDD and a first offset read voltage VRDO1, in response to the command CMD and the address ADDR (S200). The first region may be defined by the first default read voltage VRDD and the first offset read voltage VRDO1.

The control circuit 500 performs, selectively, a second sampling read operation to count a second number MCb of memory cells in a second region of the first page, using the first default read voltage VRDD and a second offset read voltage VRDO2, based on a comparison of the first number MCa and a first reference value VREF1 greater than a zero (S300). The second region may be defined by the first default read voltage VRDD and the second offset read voltage VRDO2. The first default read voltage VRDD may be one of the default read voltage set VRD1~VRD7 in FIG. 11, the first offset read voltage VRDO1 may be smaller than the first default read voltage VRDD by a first offset OFS1, and the second offset read voltage VRDO2 may be greater than the first default read voltage VRDD by a second offset OFS2. Therefore, a read operation for distinguishing a plurality of threshold voltage distributions may be performed in reduced time because the second sampling read operation may be skipped depending on the comparison result of the first number MCa and the first reference value REF1.

Referring to FIGS. 14 and 15, for performing the first sampling read operation (S200), the address decoder 430 applies the first offset read voltage VRDO1 to the first word-line, the page buffer circuit 410 latches data sensed in response to the first offset read voltage VRDO1 in the data latch DL1 as a first data (S210). The address decoder 430 applies the first default read voltage VRDD to the first word-line, the page buffer circuit 410 latches data sensed in response to the first default read voltage VRDD in the data latch DL2 as a second data (S220). The first data and the second data which are latched in the page buffer circuit 410 are provided to the buffer 541 in the read control circuit 540 via the data input/output circuit 420, the exclusive OR logic performs an exclusive OR operation on the first data DTA1 and the second DTA2 to provide a first operation data ODTA1 to the counter (S230). The counter 545 counts a number of the first bits in the first operation data ODTA1 and provides the decision logic 550 with the counting value CV corresponding to the first number MCa (S240).

Figure 16A:
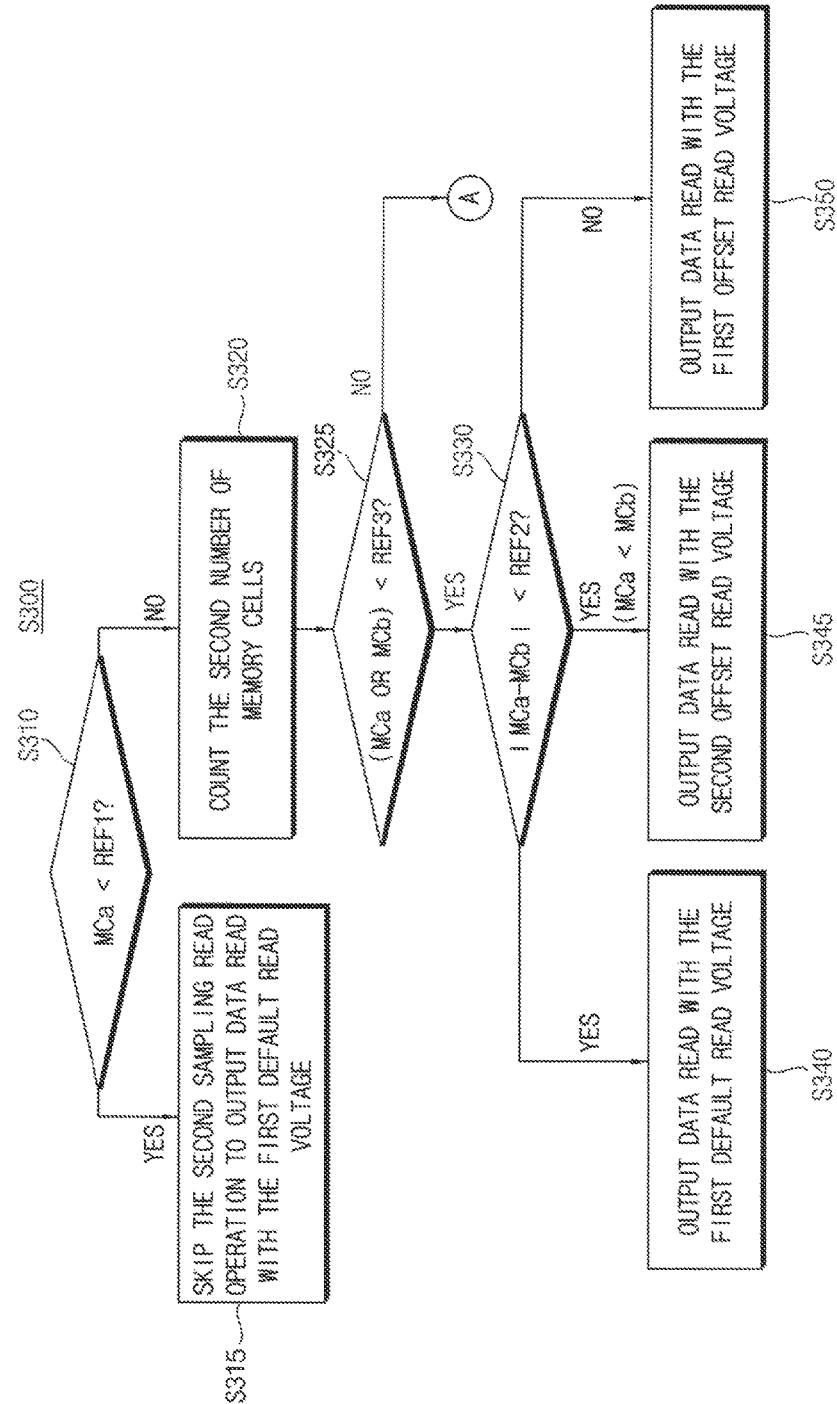
FIGS. 16A and 16B are flow charts illustrating second sampling operation in FIG. 13 according to exemplary embodiments.
Figure 16B:
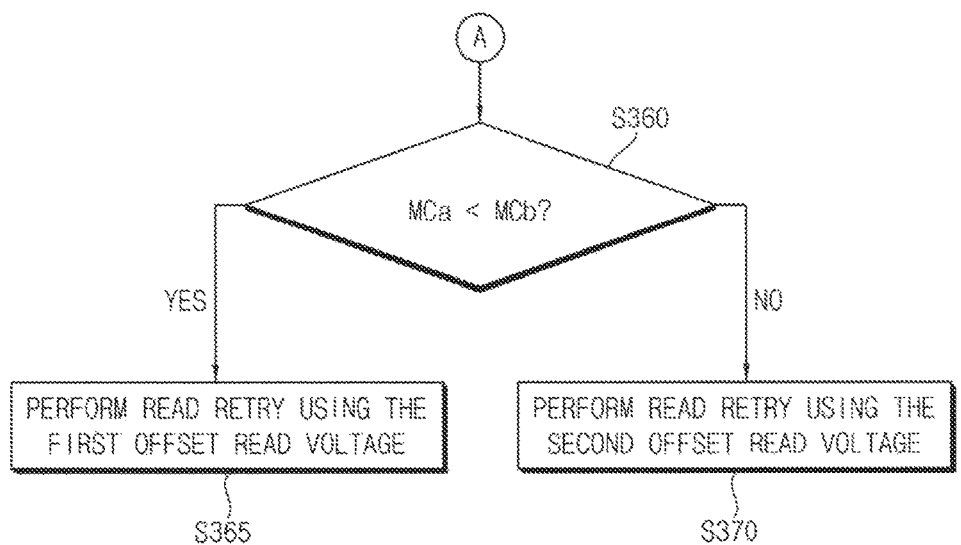

FIGS. 16A and 16B are flow charts illustrating second sampling operation in FIG. 13 according to exemplary embodiments.

Referring to FIGS. 2 through 12, 15, 16A and 16B, for performing, selectively, the second sampling read operation (S300), the decision logic 550 determines whether the first number MCa is smaller than the first reference value REF1 (S310). When the first number MCa is smaller than the first reference value REF1 (YES in S310), the second sampling read operation is skipped and the page buffer circuit 410 outputs the data read with the first default read voltage VRDD as an output data (S315). When the first number MCa is equal to or greater than the first reference value REF1 (NO in S310), the page buffer circuit 410 latches data sensed in response to the second offset read voltage VRDO2 in the third data latch DL3 as a third data, and the counter 545 counts the second number MCb of memory cells based on comparison of the second data and the third data (S320). The decision logic 550 determines whether the first number MCa or the second number MCb is smaller than the third reference value REF3 (S325). When the first number MCa or the second number MCb is smaller than the third reference value REF3 (YES in S325), the decision logic 550 determines whether an absolute value of a difference of the first number MCa and the second number MCb is smaller than the second reference value REF2 (S330).

When the absolute value of a difference of the first number MCa and the second number MCb is smaller than the second reference value REF2 (YES in S330), which indicates that the degradation of the threshold voltage distributions proceeded but does not need to adjust the first default read voltage VRDD, the control circuit 500 controls the page buffer circuit 410 such that the data which are read with the first default read voltage VRDD and is stored in the second data latch DL2 is provided as the output data by using the page buffer control signal PCTL (S340). When the absolute value of a difference of the first number MCa and the second number MCb is smaller than the second reference value REF2 and the first number MCa is smaller than the second number MCb, which indicates that the threshold voltage distribution STb corresponding to the higher state shifted more than the threshold voltage distribution STa corresponding to the lower state, the control circuit 500 controls the page buffer circuit 410 such that the data which are read with the second offset read voltage VRDO2 and is stored in the third data latch DL2 is provided as the output data by using the page buffer control signal PCTL (S345).

When the absolute value of a difference of the first number MCa and the second number MCb is equal to or greater than the second reference value REF2 (NO in S330), which indicates that the threshold voltage distribution STa corresponding to the lower state shifted more than the threshold voltage distribution STb corresponding to the higher state, the control circuit 500 controls the page buffer circuit 410 such that the data which are read with the first offset read voltage VRDO1 and is stored in the first data latch DL1 is provided as the output data by using the page buffer control signal PCTL (S350).

When the first number MCa or the second number MCb is equal to or greater than the third reference value REF3 (NO in S325), which indicates that the adjacent threshold voltage distributions STa and STb shifted greatly, the decision logic 550 determines whether the first number MCa is smaller than the second number MCb (S360).

When the first number MCa is smaller than the second number MCb (YES in S360), which indicates that the threshold voltage distribution STb corresponding to the higher state shifted more than the threshold voltage distribution STa corresponding to the lower state, the threshold voltage distribution STb has a great possibility of including UECC error and a valley moves toward the first offset read voltage VRDO1, the control circuit 500 controls the voltage generator 700 such that a read retry operation using the first offset read voltage VRDO1 is performed on the first page (S365). When the first number MCa is equal to or greater than the second number MCb (NO in S360), which indicates that the threshold voltage distribution STa corresponding to the lower state shifted more than the threshold voltage distribution STb corresponding to the higher state, the threshold voltage distribution STa has a great possibility of including UECC error and a valley moves toward the second offset read voltage VRDO2, the control circuit 500 controls the voltage generator 700 such that a read retry operation using the second offset read voltage VRDO2 is performed on the first page (S370).

FIGS. 17A through 17F illustrate various examples of adjacent threshold voltage distributions according to degrees of degradation of threshold voltage distributions.

Figure 17A:
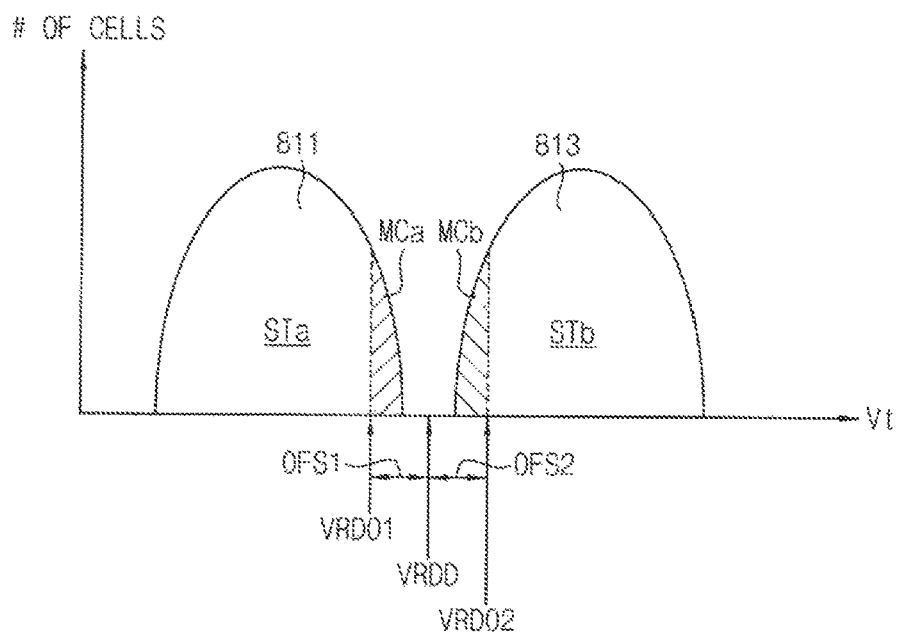
FIGS. 17A through 17F illustrate various examples of adjacent threshold voltage distributions according to degrees of degradation of threshold voltage distributions.

Referring to FIG. 17A, adjacent threshold voltage distributions STa and STb right after the first page is programmed or before the first page is degraded, respectively, have shapes

811 and 813. The first number of memory cells MCa in the first region defined by the first default read voltage VRDD and the first offset read voltage VRDO1 is smaller than the first reference value REF1, the nonvolatile memory device 200 skips the second sampling read operation and outputs the data read with the first default read voltage VRDD as the output data as in step (S315).

Figure 17B:
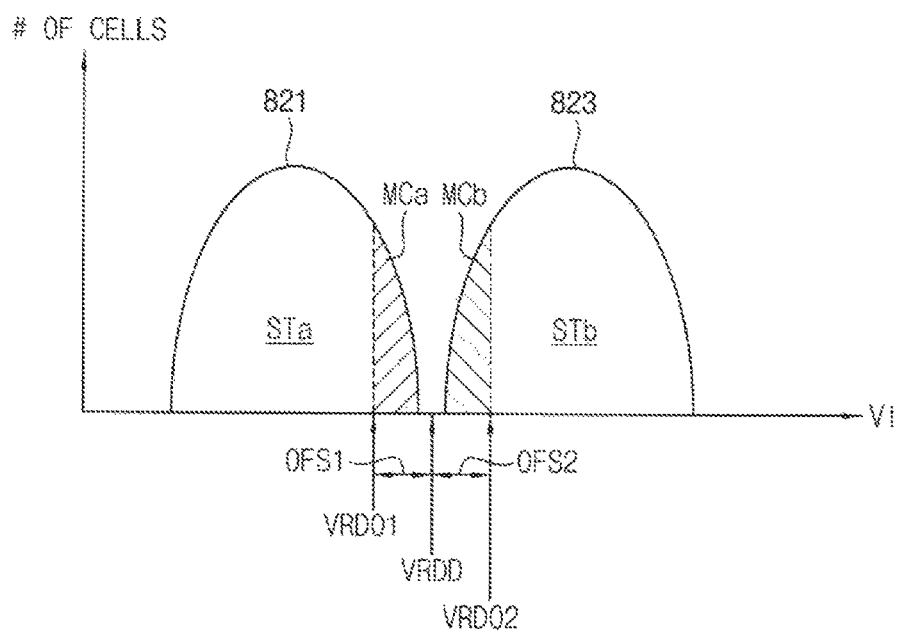

Referring to FIG. 17B, when adjacent threshold voltage distributions STa and STb respectively, have shapes 821 and 823 even though the memory cells are degraded, and when the absolute value of a difference of the first number MCa and the second number MCb is smaller than the second reference value REF2 as in steps (S330 and S340), the control circuit 500 controls the page buffer circuit 410 such that the data which are read with the first default read voltage VRDD and is stored in the second data latch DL2 is provided as the output data by using the page buffer control signal PCTL.

Figure 17C:
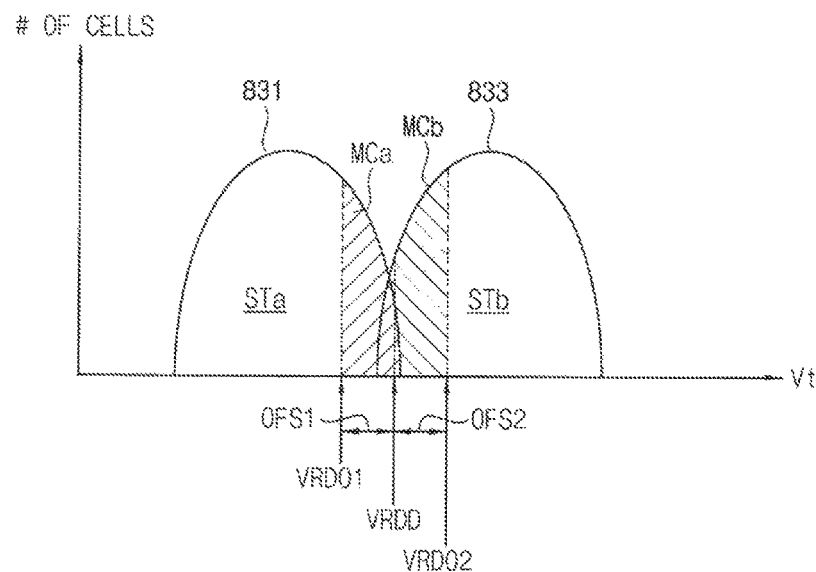

Referring to FIG. 17C, when adjacent threshold voltage distributions STa and STb respectively, have shapes 831 and 833 even though the memory cells are degraded, and when the absolute value of a difference of the first number MCa and the second number MCb is smaller than the second reference value REF2 and the first number MCa is smaller than the second number MCb as in steps (S330 and S345), the control circuit 500 controls the page buffer circuit 410 such that the data which are read with the second offset read voltage VRDO2 and is stored in the third data latch DL2 is provided as the output data by using the page buffer control signal PCTL.

Figure 17D:
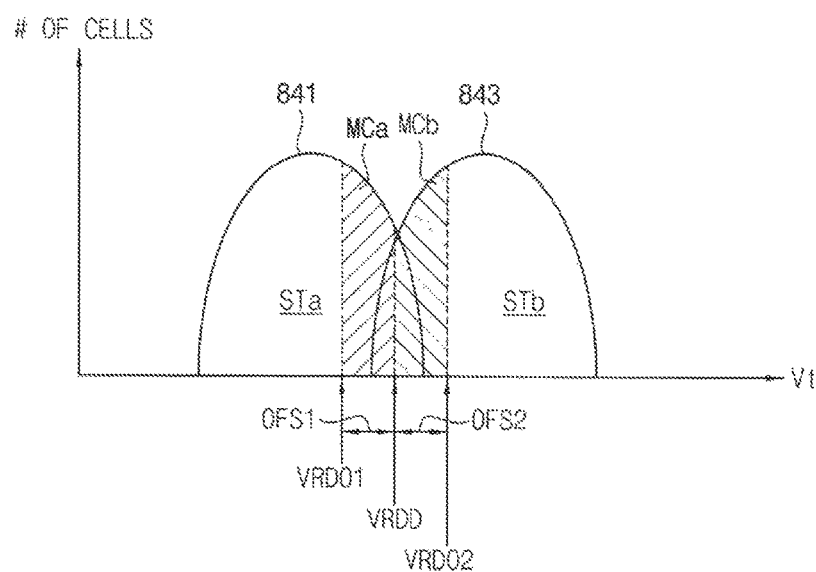

Referring to FIG. 17D, when adjacent threshold voltage distributions STa and STb respectively, have shapes 841 and 843 even though the memory cells are degraded, and when the absolute value of a difference of the first number MCa and the second number MCb is equal to or greater than the second reference value REF2 as in steps (S330 and S350), the control circuit 500 controls the page buffer circuit 410 such that the data which are read with the first offset read voltage VRDO1 and is stored in the first data latch DL1 is provided as the output data by using the page buffer control signal PCTL.

Figure 17E:
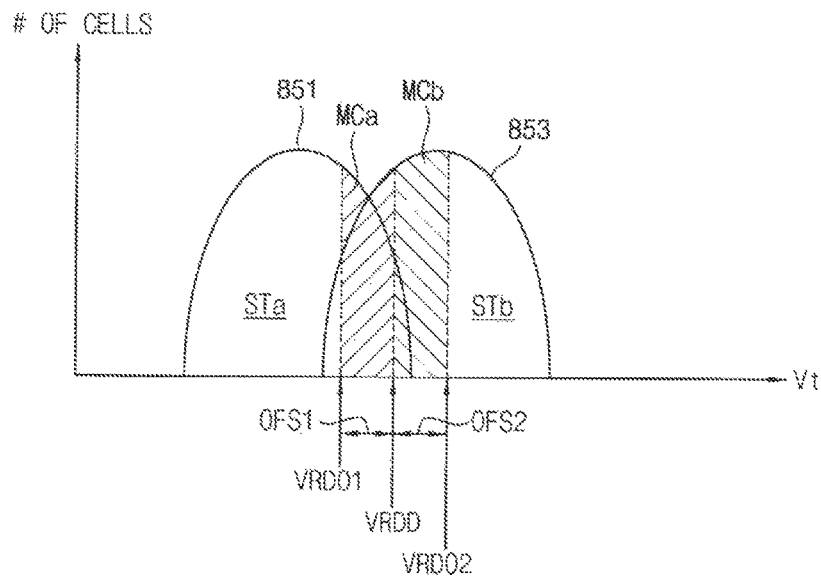

Referring to FIG. 17E, when adjacent threshold voltage distributions STa and STb respectively, have shapes 851 and 853 because the memory cells are degraded, and when the first number MCa is smaller than the second number MCb as in steps (S360 and S365), the control circuit 500 controls the voltage generator 700 such that a read retry operation using the first offset read voltage VRDO1 is performed on the first page.

Figure 17F:
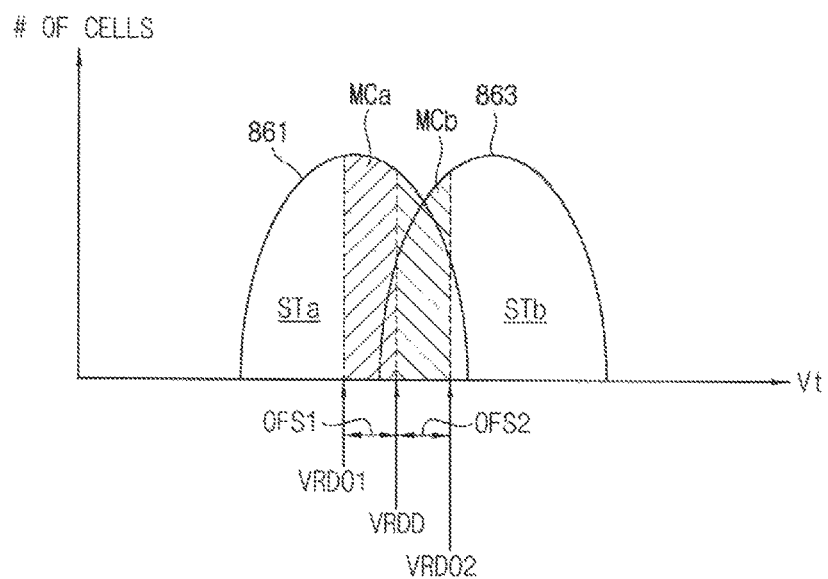

Referring to FIG. 17F, when adjacent threshold voltage distributions STa and STb respectively, have shapes 861 and 863 because the memory cells are degraded, and the first number MCa is equal to or greater than the second number MCb as in steps (S360 and S370), the control circuit 500 controls the voltage generator 700 such that a read retry operation using the second offset read voltage VRDO2 is performed on the first page.

Figure 18:
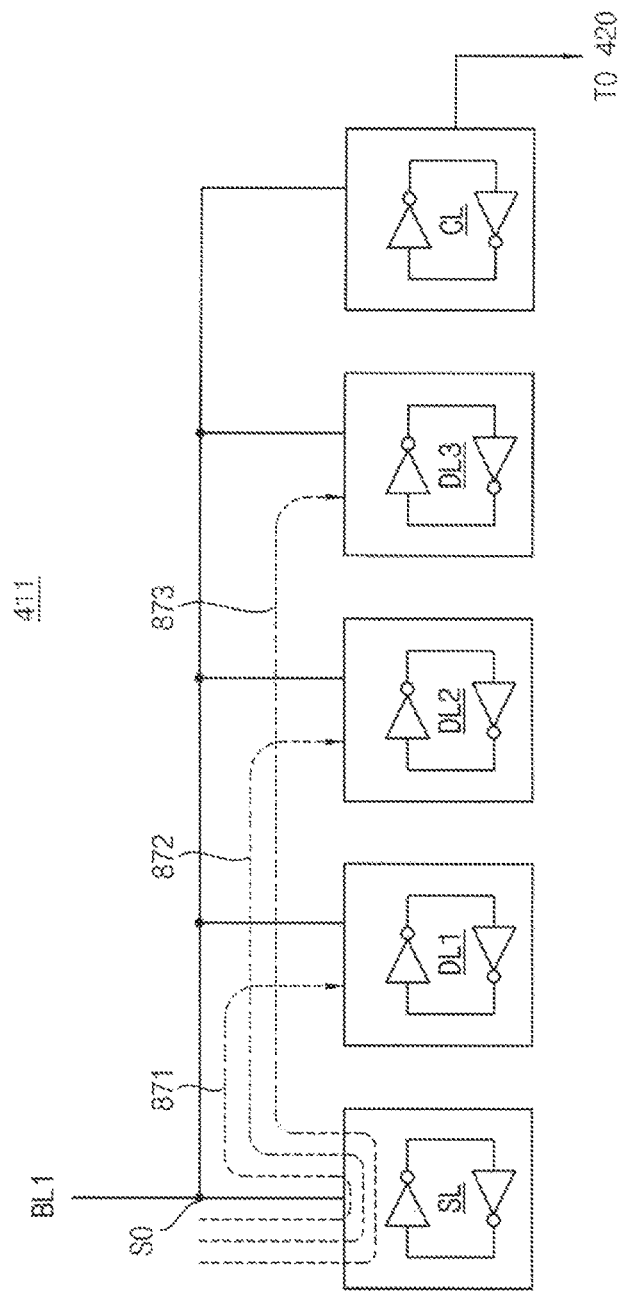
FIG. 18 illustrates operation of the page buffer circuit of FIG. 10 according to operation method according to exemplary embodiments.

FIG. 18 illustrates operation of the page buffer circuit of FIG. 10 according to operation method according to exemplary embodiments.

Although operation of the page buffer 411 is illustrated with reference to FIG. 18, operation of each of other page buffers 412~41*n* is substantially similar with the operation of the page buffer 411.

Referring to FIG. 18, the page buffer 411 includes a sensing latch SL, data latches DL1~DL3 and a cache latch CL which are connected in parallel with the bit line BL1 at a sensing node SO. Data sensed by using the first offset read voltage VRDO1 in the first sampling read operation is stored in the first data latch DL1 via the sensing latch SL as a reference numeral indicates 871, data sensed by using the first default read voltage VRDD in the first sampling read operation is stored in the second data latch DL2 via the sensing latch SL as a reference numeral indicates 872, and data sensed by using the second offset read voltage VRDO2 in the second sampling read operation is stored in the third data latch DL3 via the sensing latch SL as a reference numeral indicates 873. The data stored in the data latches DL1~DL3 may be provided to the control circuit 500 or the memory controller 100 in response to the page buffer control signal PCTL.

Figure 19:
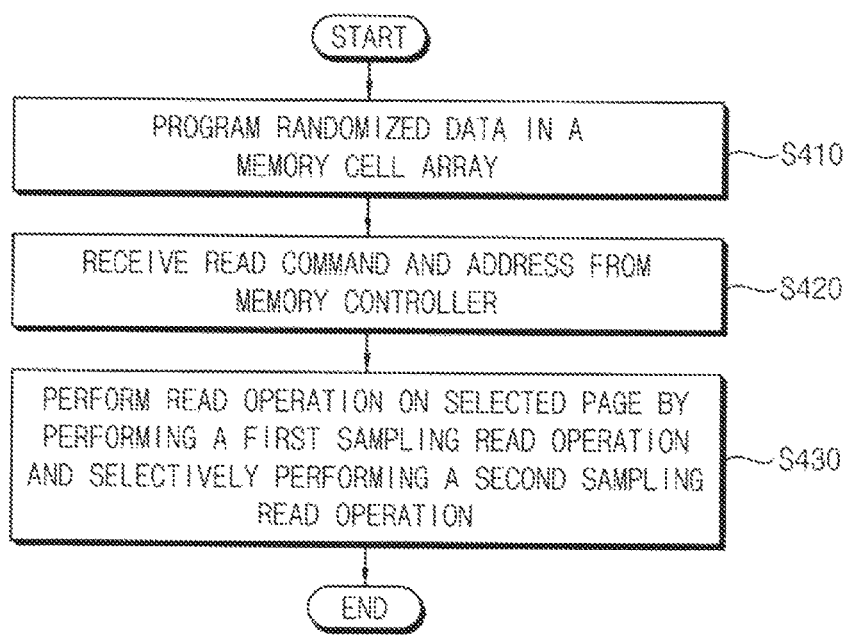
FIG. 19 is a flow chart illustrating a method of operating a nonvolatile memory device according to exemplary embodiments.

FIG. 19 is a flow chart illustrating a method of operating a nonvolatile memory device according to exemplary embodiments.

Referring to FIG. 19, the nonvolatile memory device 200 programs randomized data in a first page of the memory cell array 300 such that each of a plurality of memory cells stores a plurality of data bits as one of a plurality of threshold voltage distributions corresponding to a plurality of logic states, in response to a program command (S410). The nonvolatile memory device 200 receives a read command and an address (S420). The nonvolatile memory device performs a read operation to perform a first sampling read operation on a first region of the first page and to selectively perform a second sampling read operation on a second region of the first page according to a result of the first sampling read operation, in response to the read command and the address (S430). Accordingly, a method of operating a nonvolatile memory device and a nonvolatile memory device, during a normal read operation, count a first number of memory cells in a first region defined by the first default read voltage and a first offset read voltage, determine degree of degradation of memory cells based on a comparison of the first number and a first reference value and selectively perform a second sampling read operation based on the determination. Therefore, pass/fail of the read data may be rapidly determined on-chip. That is, the pass/fail of the read data may be performed internally in the nonvolatile memory device.

FIG. 20 is a block diagram illustrating a mobile device according to exemplary embodiments.

Referring to FIG. 20, a mobile device 1000 may include an application processor 1100, a communication module 1200, a display/touch module 1300, a storage device 1400, and a buffer RAM 1500.

The application processor 1100 controls operations of the mobile device 1000. The communication module 1200 is implemented to perform wireless or wire communications with an external device. The display/touch module 1300 is implemented to display data processed by the application processor 1100 or to receive data through a touch panel. The storage device 1400 is implemented to store user data.

The storage device 1400 may be eMMC, SSD, UFS device, etc. The storage device 1400 may employ the storage device 30 of FIG. 2. The storage device 1400 may include a memory controller and at least one nonvolatile memory device. The nonvolatile memory device may count a first number of memory cells in a first region defined by the first default read voltage and a first offset read voltage, determines degree of degradation of memory cells based on a comparison of the first number and a first reference value and selectively perform a second sampling read operation based on the determination during a normal read operation.

Therefore, the nonvolatile memory device rapidly determines pass/fail of the read data on-chip.

The buffer RAM 1500 temporarily stores data used for processing operations of the mobile device 1000.

A nonvolatile memory device or a storage device according to exemplary embodiments may be packaged using various package types or package configurations.

The present disclosure may be applied to various electronic devices including a nonvolatile memory device. For example, the present disclosure may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present disclosure. Accordingly, all such modifications are intended to be included within the scope of the present disclosure as defined in the claims.

What is claimed is:

1. A method of operating a nonvolatile memory device including a memory cell array, wherein the memory cell array includes a plurality of pages, each of the plurality of pages includes a plurality of nonvolatile memory cells, each of the plurality of nonvolatile memory cells is configured to store a plurality of data bits, and the plurality of data bits are distinguished from one another by different threshold voltages, the method comprising:
   performing a first sampling read operation to count a first number of memory cells in a first region of a first page selected from the plurality of pages, using a first default read voltage and a first offset read voltage, in response to a command and an address received from a memory controller; and
   performing, selectively, a second sampling read operation to count a second number of memory cells in a second region of the first page, using the first default read voltage and a second offset read voltage, based on a comparison result of the first number and a first reference value,
   wherein the second offset read voltage is different from the first offset read voltage, and
   wherein performing the first sampling read operation comprises:
   latching first data to a page buffer circuit coupled to the memory cell array, wherein the first data is sensed by applying the first offset read voltage to a first word-line coupled to the first page;
   latching second data to the page buffer circuit, wherein the second data is sensed by applying the first default read voltage to the first word-line;
   performing an exclusive OR operation on the first data and the second data to generate a first operation data which indicates a match between corresponding bits of the first data and the second data; and
   counting a number of first bits in the first operation data to provide the first number.

2. The method of claim 1, wherein the first default read voltage is a read reference voltage to distinguish a first data state from a second data state that is adjacent to the first data state, and the first and second data states are programmed to have different threshold voltage distribution.

3. The method of claim 2, wherein the page buffer circuit includes a plurality of page buffers coupled to the memory cell array through a plurality of bit-lines,
   each of the plurality of page buffers includes a sensing latch, a first data latch, a second data latch, and a third data latch which are connected in parallel with a corresponding one of the plurality of bit-lines at a sensing node,
   the first data is latched to the first data latch of each of the plurality of page buffers via the sensing latch of each of the plurality of page buffers, and
   the second data is latched to the second data latch of each of the plurality of page buffers via the sensing latch of each of the plurality of page buffers.

4. The method of claim 1, wherein performing, selectively, the second sampling read operation comprises:
   comparing the first number and the first reference value; and
   outputting data read using the first default read voltage as output data when the first number is smaller than the first reference value.

5. The method of claim 4, wherein when the first number is greater than or equal to the first reference value, the method further comprises:
   counting the second number of memory cells to compare the first number and the second number; and
   determining whether the first number or the second number is less than a third reference value,
   wherein the third reference value is greater than the first reference value.

6. The method of claim 5, wherein when the first number or the second number is smaller than the third reference value, the method further comprises:
   determining whether an absolute value of a difference between the first number and the second number is smaller than a second reference value;
   outputting data read using the first default read voltage as the output data when the absolute value of the difference between the first number and the second number is smaller than the second reference value;
   outputting data read using the second offset read voltage as the output data when the absolute value of the difference between the first number and the second number is smaller than the second reference value, and the first number is smaller than the second number; and
   outputting data read using the first offset read voltage as the output data when the absolute value of the difference between the first number and the second number is greater than or equal to the second reference value,
   wherein the second reference value is greater than the first reference value and smaller than the third reference value.

7. The method of claim 5, wherein when the first number or the second number is greater than or equal to the third reference value, the method further comprises:
   determining whether the second number is greater than the first number.

8. The method of claim 7, wherein the method further comprises:
   performing a read retry operation on the first page using the first offset read voltage when the second number is greater than the first number; and
   performing the read retry operation on the first page using the second offset read voltage when the second number is smaller than or equal to the first number.

9. The method of claim 5, wherein counting the second number of memory cells comprises:
- latching third data to the page buffer circuit coupled to the memory cell array, wherein the third data is sensed by applying the first default read voltage to the first word-line coupled to the first page;
- latching fourth data to the page buffer circuit, wherein the fourth data is sensed by applying the second offset read voltage to the first word-line;
- performing an exclusive OR operation on the third data and the fourth data to generate a second operation data which indicates a match between corresponding bits of the third data and the fourth data: and
- counting a number of first bits in the second operation data to provide the second number.

10. The method of claim 1,
wherein a level of the first offset read voltage is smaller than a level of the first default read voltage and a level of the second offset read voltage is greater than the level of the first default read voltage,
wherein the memory cell array comprises:
- first memory cells coupled to the first word-line; and
- second memory cells coupled to a second word-line and stacked on the first memory cells, and
wherein at least one of the level of the first default read voltage, the level of the first offset read voltage, and the level of the second offset read voltage varies with respect to the first word-line and the second word-line.

11. The method of claim 1, wherein the first region is defined by the first default read voltage and the first offset read voltage, and
the second region is defined by the first default read voltage and the second offset read voltage.

12. The method of claim 1, wherein each of the plurality of nonvolatile memory cells is configured to store the plurality of data bits as one of a plurality of threshold voltage distributions corresponding to a plurality of logic states.

13. A nonvolatile memory device, comprising:
- a memory cell array including a plurality of pages, wherein each of the plurality of pages includes a plurality of nonvolatile memory cells, each of the plurality of nonvolatile memory cells stores a plurality of data bits, and the plurality of data bits are distinguished from one another by different threshold voltages;
- a page buffer circuit coupled to the memory cell array through a plurality of bit-lines;
- a voltage generator configured to generate a first default read voltage, a first offset read voltage, and a second offset read voltage; and
- a control circuit configured to, through the voltage generator and the page buffer circuit:
- perform a first sampling read operation to count a first number of memory cells in a first region of a first page selected from the plurality of pages, using the first default read voltage and the first offset read voltage, in response to a command and an address received from a memory controller; and
- perform, selectively, a second sampling read operation to count a second number of memory cells in a second region of the first page, using the first default read voltage and the second offset read voltage, based on a comparison result of the first number and a first reference value greater than a zero,
wherein the second offset read voltage is different from the first offset read voltage,
wherein the control circuit comprises:
- a read control circuit configured to provide the control signal generator with a decision signal to direct whether to perform the second sampling read operation using a first data, a second data, and the first reference value,
wherein the first data and the second data are sensed by the first sampling read operation, and
wherein the read control circuit comprises:
- a buffer configured to store the first data and the second data, wherein the first data is sensed by applying the first offset read voltage to a first word-line coupled to the first page, and the second data is sensed by applying the first default read voltage to the first word-line;
- an exclusive OR logic configured to perform an exclusive OR operation on the first data and the second data to generate a first operation data which indicates a match between corresponding bits of the first data and the second data;
- a counter configured to count a number of first bits in the first operation data to provide a counting value corresponding to the first number; and
- a decision logic configured to compare the counting value and the first reference value to output the decision signal indicating a comparison result of the counting value and the first reference value.

14. The nonvolatile memory device of claim 13, wherein the first default read voltage is a read reference voltage to distinguish a first data state from a second data state that is adjacent to the first data state, and the first and second data states are programmed to have different threshold voltage distributions, and
wherein the control circuit further comprises:
- a command decoder configured to decode the command to provide a decoded command; and
- a control signal generator configured to generate voltage control signals to control the voltage generator and a page buffer control signal to control the page buffer circuit, in response to the decoded command.

15. The nonvolatile memory device of claim 14, wherein the page buffer circuit includes a plurality of page buffers coupled to the memory cell array through the plurality of bit-lines, and
each of the plurality of page buffers includes a sensing latch, a first data latch, a second data latch, and a third data latch which are connected in parallel with a corresponding one of the plurality of bit-lines at a sensing node.

16. The nonvolatile memory device of claim 15, wherein:
the first data is latched to the first data latch of each of the plurality of page buffers via the sensing latch of each of the plurality of page buffers, and the latched first data is provided to the buffer via a cache latch,
the second data is latched to the second data latch of each of the plurality of page buffers via the sensing latch of each of the plurality of page buffers and the latched second data is provided to the buffer via the cache latch,
wherein the memory cell array comprises:
first memory cells coupled to the first word-line; and
second memory cells coupled to a second word-line and stacked on the first memory cells, and
wherein at least one of a level of the first default read voltage, a level of the first offset read voltage, and a level of the second offset read voltage varies with respect to the first word-line and the second word-line.

17. A method of operating a nonvolatile memory device including a memory cell array, wherein the memory cell array includes a plurality of pages, each of the plurality of pages includes a plurality of nonvolatile memory cells, and each of the plurality of nonvolatile memory cells is configured to store a plurality of data bits, the method comprising:

programming randomized data in a first page selected among the plurality of pages in response to a program command such that each of the plurality of nonvolatile memory cells is configured to store the plurality of data bits as one of a plurality of threshold voltage distributions corresponding to a plurality of logic states;

receiving a read command and an address from a memory controller; and performing a read operation on the first page in response to the read command and the address, wherein the read operation includes a first sampling read operation on a first region of the first page and a selective second sampling read operation on a second region of the first page, wherein the selective second sampling read operation is selectively performed based on a comparison result of a first number and a first reference value, and wherein performing the first sampling read operation comprises:

latching first data to a page buffer circuit coupled to the memory cell array, wherein the first data is sensed by applying a first offset read voltage to a first word-line coupled to the first page;

latching second data to the page buffer circuit, wherein the second data is sensed by applying a first default read voltage to the first word-line;

performing an exclusive OR operation on the first data and the second data to generate a first operation data which indicates a match between corresponding bits of the first data and the second data; and counting a number of first bits in the first operation data to provide the first number.

18. The method of claim 17, wherein the first sampling read operation and the selective second sampling read operation are performed internally in the nonvolatile memory device.

* * * * *